(12) United States Patent
Lee et al.

(10) Patent No.: US 12,482,801 B2
(45) Date of Patent: Nov. 25, 2025

(54) SEMICONDUCTOR PACKAGE

(71) Applicant: SAMSUNG ELECTRONICS CO., LTD., Suwon-si (KR)

(72) Inventors: Manho Lee, Hwaseong-si (KR); Keung Beum Kim, Hwaseong-si (KR); Kyung Suk Oh, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 345 days.

(21) Appl. No.: 17/994,880

(22) Filed: Nov. 28, 2022

(65) Prior Publication Data

US 2023/0260983 A1 Aug. 17, 2023

(30) Foreign Application Priority Data

Feb. 15, 2022 (KR) ........................ 10-2022-0019527

(51) Int. Cl.
| | | |
|---|---|---|
| *H01L 25/18* | (2023.01) | |
| *H01L 23/31* | (2006.01) | |
| *H01L 23/34* | (2006.01) | |
| *H01L 23/538* | (2006.01) | |

(Continued)

(52) U.S. Cl.
CPC .......... *H01L 25/18* (2013.01); *H01L 23/3107* (2013.01); *H01L 23/34* (2013.01); *H01L 23/5383* (2013.01); *H01L 23/5385* (2013.01); *H01R 12/79* (2013.01); *H01L 24/08* (2013.01);

(Continued)

(58) Field of Classification Search
CPC ..... H01L 25/18; H01L 23/3107; H01L 23/34; H01L 23/5383; H01L 23/5385; H01L 24/08; H01L 24/16; H01L 2224/08225; H01L 2224/16227; H01L 23/4006; H01L 2023/4043; H01L 23/36; H01L 23/5389; H01L 23/49811; H01L 23/367; H01L 23/49838; H01L 25/0652; H01L 23/49827; H01L 25/0657; H01L 25/105; H01L 25/16; H01L 2225/06524; H01L 2225/06527; H01L 2225/06541; H01R 12/79

See application file for complete search history.

(56) References Cited

U.S. PATENT DOCUMENTS

| | | |
|---|---|---|
| 6,252,264 B1 | 6/2001 | Bailey et al. |
| 8,679,896 B2 | 3/2014 | Joshi et al. |
| 8,873,245 B2 | 10/2014 | Kim et al. |

(Continued)

FOREIGN PATENT DOCUMENTS

| | | |
|---|---|---|
| CN | 1828891 A | 9/2006 |
| CN | 105990500 A | 10/2016 |

(Continued)

*Primary Examiner* — Evan G Clinton
(74) *Attorney, Agent, or Firm* — Sughrue Mion, PLLC

(57) ABSTRACT

A semiconductor package includes a package substrate, a power module on a first surface of the package substrate, a connector on the first surface of the package substrate, the connector being horizontally spaced apart from the power module, a first semiconductor chip on a second surface of the package substrate opposite to the first surface, and a first heat radiator on the second surface of the package substrate, the first heat radiator covering the first semiconductor chip. The first semiconductor chip vertically overlaps the power module, and the first semiconductor chip is electrically connected through the package substrate to the power module.

15 Claims, 21 Drawing Sheets

(51) Int. Cl.
*H01R 12/79* (2011.01)
*H01L 23/00* (2006.01)
(52) U.S. Cl.
CPC .... *H01L 24/16* (2013.01); *H01L 2224/08225* (2013.01); *H01L 2224/16227* (2013.01)

(56) References Cited

U.S. PATENT DOCUMENTS

| | | |
|---|---|---|
| 9,048,112 B2 | 6/2015 | Pan et al. |
| 9,107,290 B1 | 8/2015 | Chen |
| 9,147,643 B2 | 9/2015 | You et al. |
| 9,406,648 B2 | 8/2016 | Wang et al. |
| 9,478,474 B2 | 10/2016 | Chen et al. |
| 10,886,263 B2 | 1/2021 | Chen et al. |
| 11,121,052 B2 | 9/2021 | Lai et al. |
| 2006/0198570 A1 | 9/2006 | Ogawa et al. |
| 2016/0273741 A1 | 9/2016 | Jung |
| 2020/0212018 A1 | 7/2020 | Lai et al. |
| 2020/0243429 A1 | 7/2020 | Lai et al. |
| 2020/0381362 A1* | 12/2020 | Tseng .................. H01L 21/6835 |
| 2021/0125960 A1 | 4/2021 | Huang et al. |
| 2021/0193548 A1* | 6/2021 | Wan .................... H01L 23/3736 |
| 2021/0233835 A1 | 7/2021 | Lai et al. |
| 2021/0407887 A1* | 12/2021 | Yu ........................ H01L 23/3157 |
| 2022/0247315 A1* | 8/2022 | Ren ........................... H02J 1/14 |

FOREIGN PATENT DOCUMENTS

| | | |
|---|---|---|
| KR | 10-2020-0081231 A | 7/2020 |
| WO | WO-2022010155 A1 * | 1/2022 |

* cited by examiner

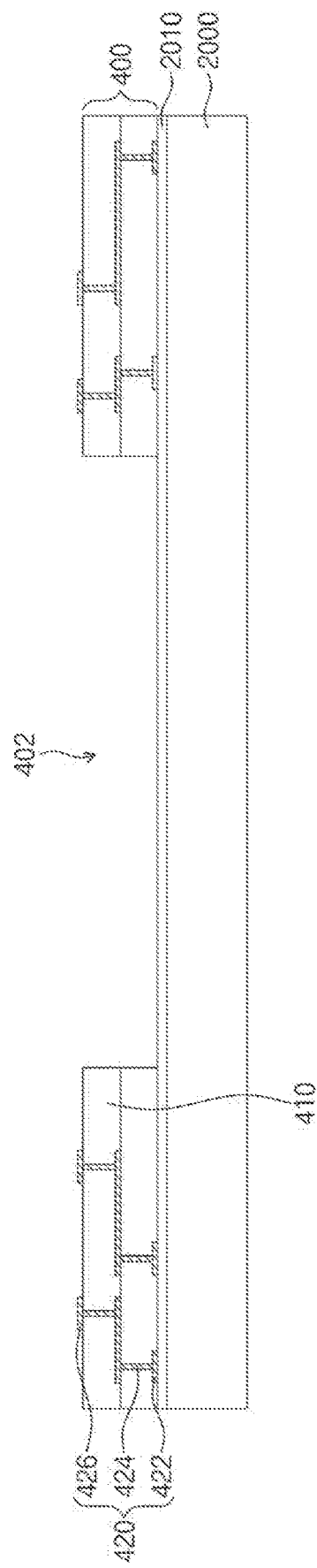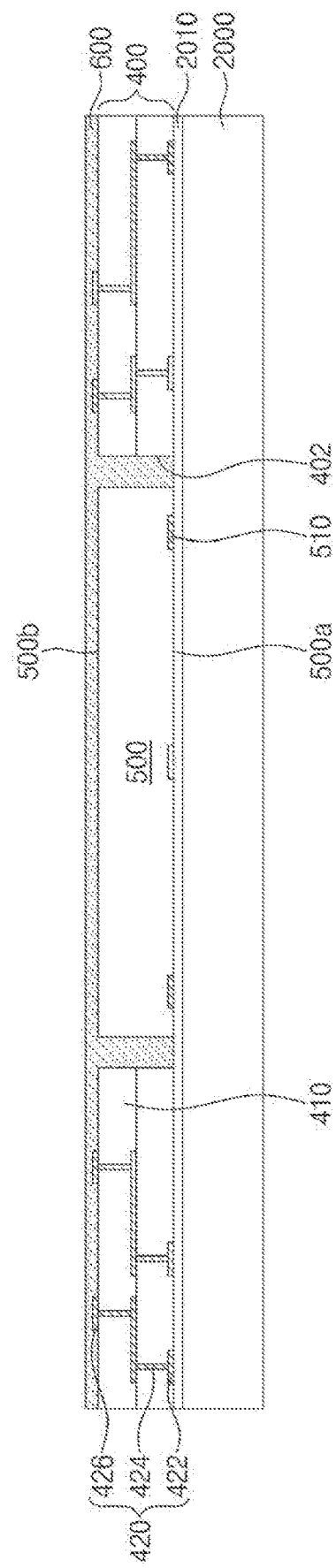

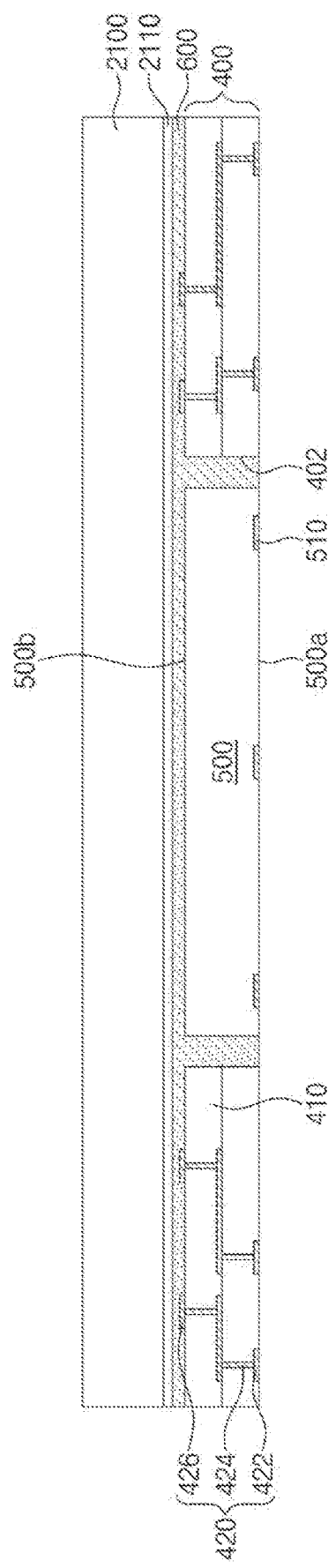
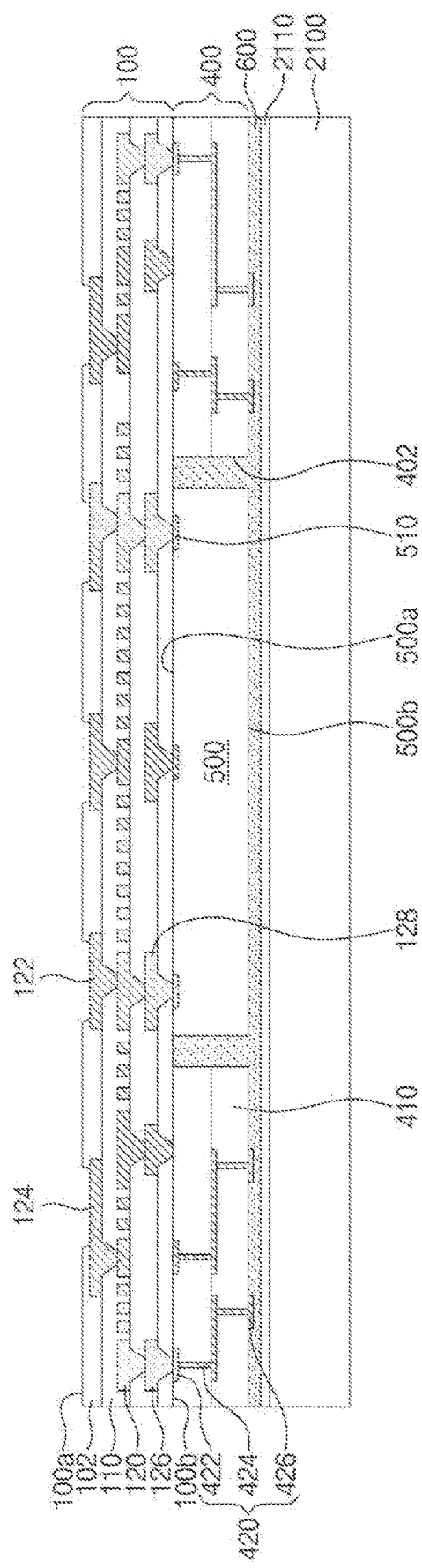

SEMICONDUCTOR PACKAGE

CROSS-REFERENCE TO RELATED APPLICATION

This U.S. nonprovisional application claims priority under 35 U.S.C. § 119 to Korean Patent Application No. 10-2022-0019527 filed on Feb. 15, 2022 in the Korean Intellectual Property Office, the disclosure of which is hereby incorporated by reference in its entirety.

BACKGROUND

The present disclosure relates to a semiconductor package, and more particularly, to a semiconductor package having a power module.

The electronic industry has recently been moving to smaller and thinner printed circuit boards with the rapid development of thinner, lighter, and smaller electronic products having higher packing density. Together with portability of electronic devices, multi-functionality and mass data transceiving functions necessitate complicated printed circuit board designs. As a result, there has been increased need for multi-layered printed circuit boards including power supply circuits, ground circuits, signal circuits, etc.

A variety of semiconductor chips, such as central processing units and power integrated circuits, are mounted on multi-layered printed circuit boards. Such semiconductor chips generate high temperature heat when the semiconductor chips are operated in use. The high temperature heat may cause semiconductor chips to suffer from overload that leads to malfunctions thereof.

SUMMARY

It is an aspect to provide a semiconductor package with increased electrical properties.

It is another aspect to provide a compact-sized semiconductor package.

It is another aspect to provide a semiconductor package with improved structural stability.

The aspects are not limited to those mentioned above, and other aspects which have not been mentioned above will be clearly understood to those skilled in the art from the following description.

According to some embodiments, semiconductor package may include a package substrate; a power module on a first surface of the package substrate; a connector on the first surface of the package substrate, the connector being horizontally spaced apart from the power module; a first semiconductor chip on a second surface of the package substrate opposite to the first surface; and a first heat radiator on the second surface of the package substrate, the first heat radiator covering the first semiconductor chip, wherein at least a portion of the first semiconductor chip vertically overlaps the power module, and wherein the first semiconductor chip is electrically connected through the package substrate to the power module.

According to some embodiments, a semiconductor package may include a package substrate having a central region and a peripheral region on opposite sides of the central region, the peripheral region being at an outer edge of the package substrate; a power module on the central region and on a first surface of the package substrate; a heat radiator on a second surface of the package substrate; a first connection substrate between the package substrate and the heat radiator and having a first opening that penetrates the first connection substrate; a first semiconductor chip on the second surface of the package substrate and in the first opening of the first connection substrate; and a first dielectric layer in the first opening and filling a space between the first connection substrate and the first semiconductor chip, wherein an active surface of the first semiconductor chip is in contact with the package substrate, and wherein the first semiconductor chip is electrically connected through the package substrate to the power module.

According to some embodiments, a semiconductor package nay include a package substrate having a central region and a peripheral region on opposite sides of the central region, the peripheral region being at an outer edge of the package substrate; a power module on the central region and on a first surface of the package substrate; a connector on the peripheral region and on the first surface of the package substrate; a first semiconductor chip on a second surface of the package substrate; and a first dielectric layer on the package substrate and surrounding the first semiconductor chip. The first semiconductor chips may include a first interposer on the package substrate; a die stack on the first interposer and including a plurality of vertically stacked first dies; a second die on the first interposer and horizontally spaced apart from the die stack; and a molding layer on the first interposer and surrounding the die stack and the second die, the molding layer exposing a top surface of the die stack. The semiconductor package may be connected to an external device through a cable coupled to the connector.

BRIEF DESCRIPTION OF THE DRAWINGS

FIGS. 16 to 23 illustrate cross-sectional views showing a method of fabricating a semiconductor package according to some embodiments.

DETAIL DESCRIPTION

The following will now describe a semiconductor package according to the present inventive concepts with reference to the accompanying drawings.

Figure 1:
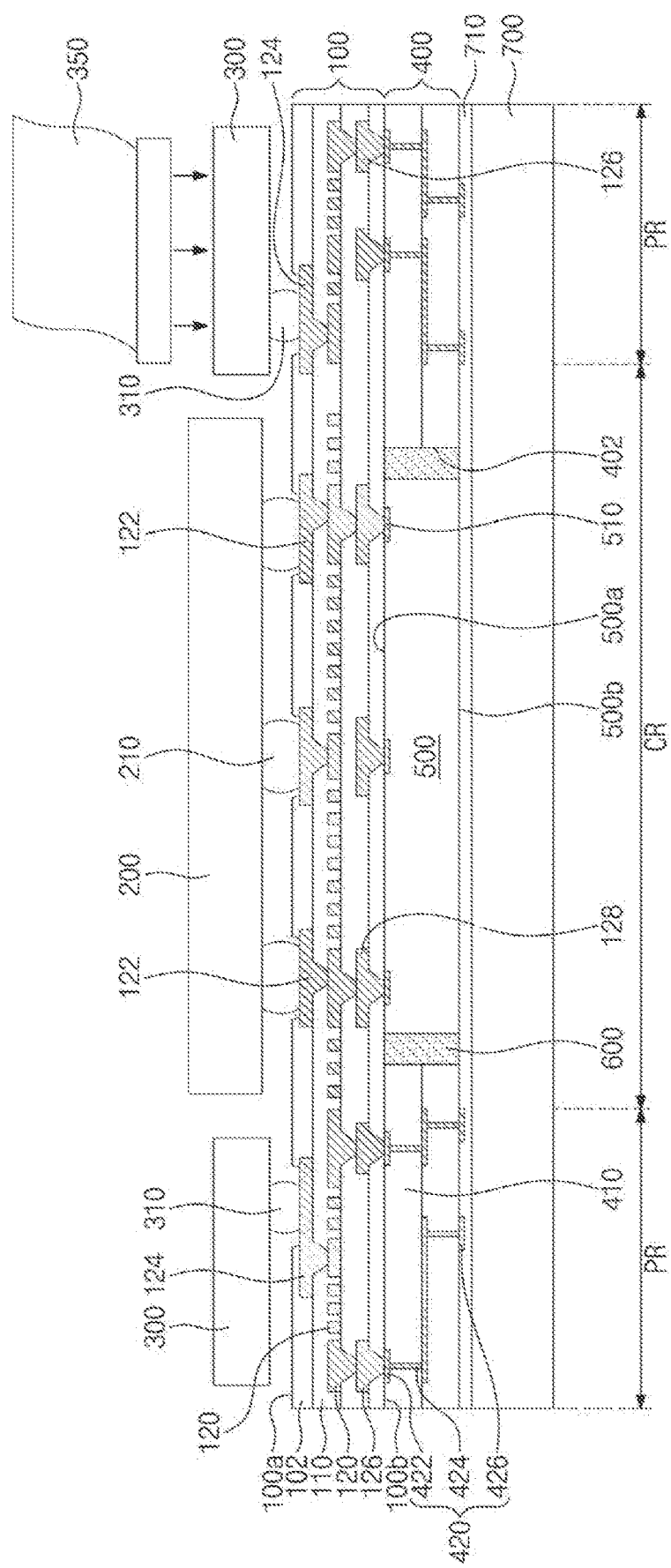
FIGS. 1 to 5 illustrate cross-sectional views showing a semiconductor package according to some embodiments.
Figure 2:
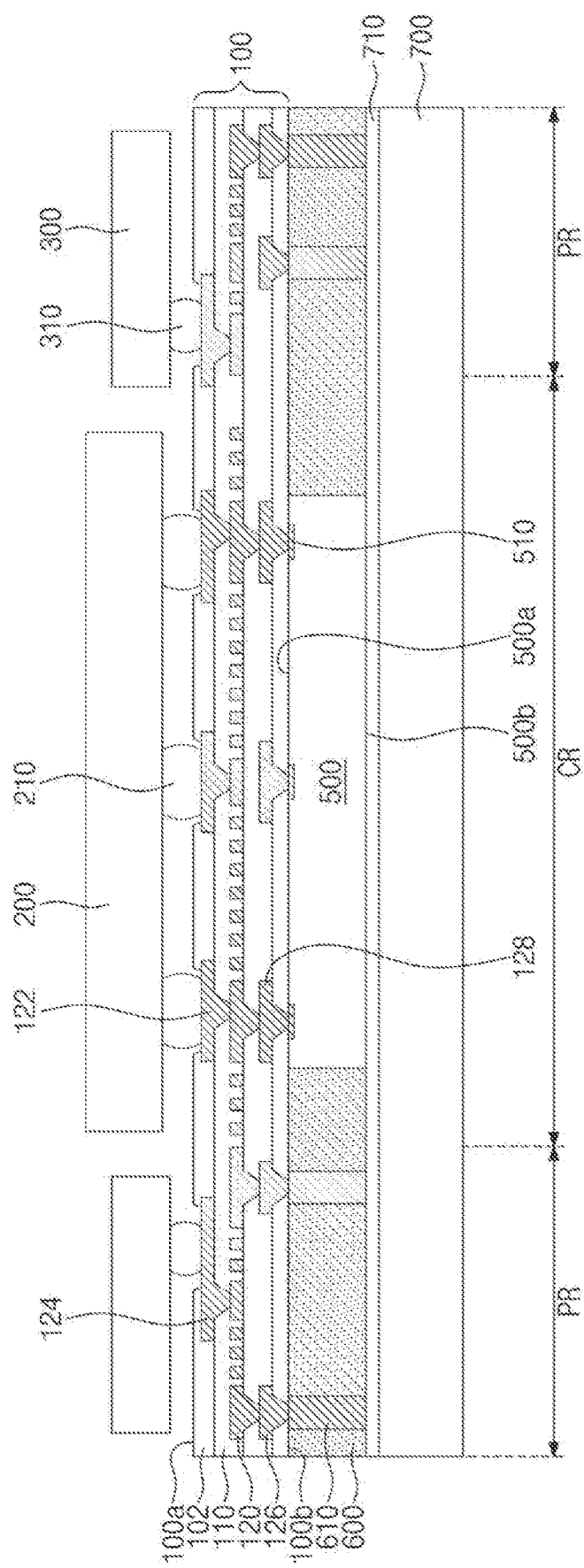
Figure 3:
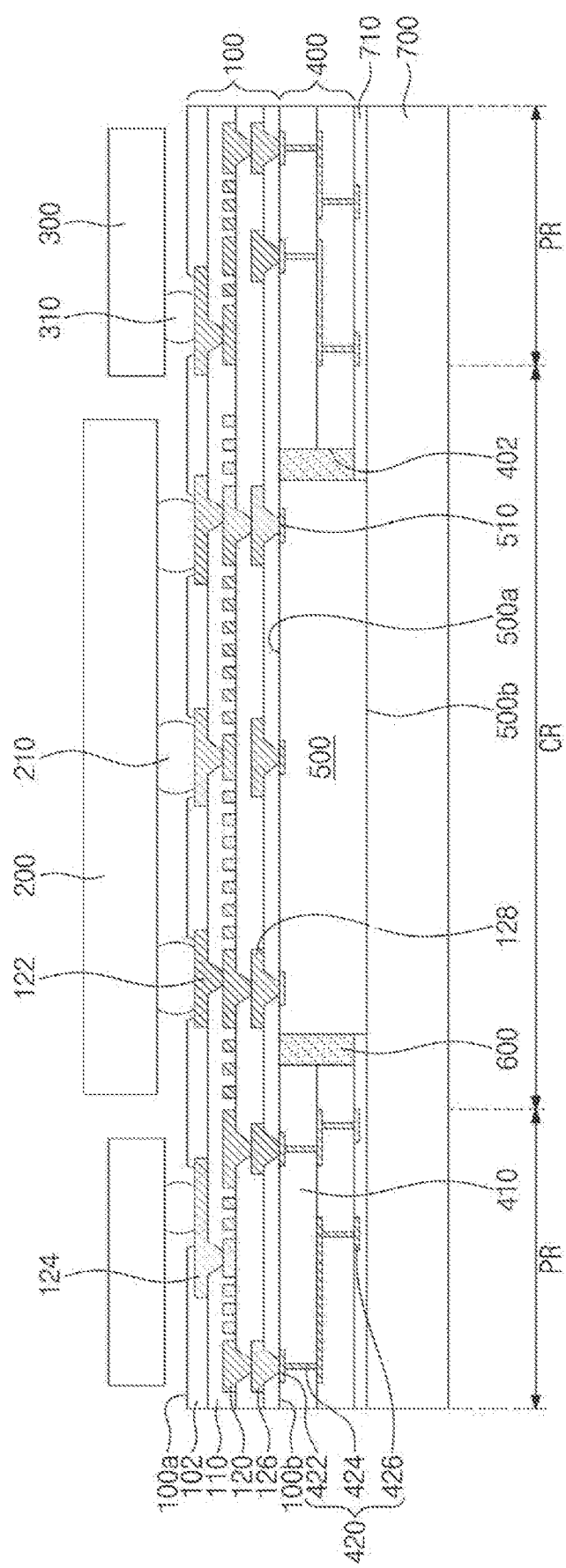

FIGS. 1 to 3 illustrate cross-sectional views showing a semiconductor package according to some embodiments.

Referring to FIG. 1, a package substrate 100 may be provided. The package substrate 100 may be a redistribution substrate. The package substrate 100 may include one or more substrate wiring layers that are stacked on each other. Each of the substrate wiring layers may include a substrate dielectric pattern 110 and a substrate wiring pattern 120 in the substrate dielectric pattern 110. The substrate wiring pattern 120 of one substrate wiring layer may be electrically connected to the substrate wiring pattern 120 of a neighboring substrate wiring layer. Hereinafter, one substrate wiring layer will be selected by way of example to describe a configuration of the package substrate 100.

In some embodiments, the substrate dielectric pattern 110 may include a dielectric polymer or a photo-imageable dielectric (PID). For example, the photo-imageable dielectric may include at least one selected from photosensitive polyimide, polybenzoxazole (PBO), phenolic polymers, and benzocyclobutene polymers. In some embodiments, the substrate dielectric pattern 110 may include a dielectric material. For example, the substrate dielectric pattern 110 may include silicon oxide (SiO), silicon nitride (SiN), silicon oxynitride (SiON), or dielectric polymers.

The substrate wiring pattern 120 may be provided on the substrate dielectric pattern 110. The substrate wiring pattern 120 may horizontally extend on the substrate dielectric pattern 110. The substrate wiring pattern 120 may be a component for redistribution in the substrate wiring layer. The substrate wiring pattern 120 may include a conductive material. For example, the substrate wiring pattern 120 may include copper (Cu).

The substrate wiring pattern 120 may have a damascene structure. For example, the substrate wiring pattern 120 may have a head portion and a tail portion that are integrally connected to each other. The head portion and the tail portion may have no interface therebetween. In this configuration, a width of the head portion connected to the tail portion may be greater than a width of the tail portion. Therefore, the head and tail portions of the substrate wiring pattern 120 may have a T-shaped cross section.

The head portion of the substrate wiring pattern 120 may be a wire or pad part that horizontally expand a wiring line in the package substrate 100. The head portion may be provided on a top surface of the substrate dielectric pattern 110. For example, the head portion may protrude onto the top surface of the substrate dielectric pattern 110. The head portion of the substrate wiring pattern 120 in an uppermost one of the substrate wiring layers may correspond to first substrate pads 122 for mounting a subsequently described power module 200 on the package substrate 100 and to second substrate pads 124 for mounting a subsequently described connector 300 on the package substrate 100. The power module 200 may be electrically connected to the connector 300 through the first substrate pads 122, wiring lines in the package substrate 100, and the second substrate pads 124, and may transceive one or more of power and input/output signals through the connector 300. The first substrate pads 122 may be disposed on a central region CR of the package substrate 100, and the second substrate pads 124 may be disposed on a peripheral region PR of the package substrate 100.

The tail portion of the substrate wiring pattern 120 may be a via part for vertical connection of a wiring line in the package substrate 100. The tail portion may be connected to a bottom surface of the head portion. The tail portion may be coupled to another substrate wiring layer disposed thereunder. For example, the tail portion of the substrate wiring pattern 120 may extend from the bottom surface of the head portion, and may penetrate the substrate dielectric pattern 110 to be coupled to the head portion of the substrate wiring pattern in another substrate wiring layer disposed below the tail portion. The tail portion of the substrate wiring pattern 120 in a lowermost of the substrate wiring layers may be exposed on a bottom surface of the substrate dielectric pattern 110. The tail portion, exposed on the bottom surface of the substrate dielectric pattern 110, of the substrate wiring pattern 120 in the lowermost substrate wiring layer may correspond to third substrate pads 126 for mounting a subsequently described connection substrate 400 on the package substrate 100 and to fourth substrate pads 128 for mounting a subsequently described semiconductor chip 500 on the package substrate 100.

A first protection layer 102 may be provided on the uppermost substrate wiring layer. The first protection layer 102 may cover a top surface of an uppermost substrate dielectric pattern 110, the first substrate pads 122, and the second substrate pads 124. The first protection layer 102 may be a component for protecting the substrate wiring layers of the package substrate 100. In this configuration, the first substrate pads 122 and the second substrate pads 124 may be exposed by a recess formed in the first protection layer 102. The recess may be an area on which are provided terminals coupled to the first substrate pads 122 and the second substrate pads 124. The first protection layer 102 may include a dielectric material. For example, the first protection layer 102 may include an inorganic material, an organic material, ABF (Ajinomoto Build-up Film), or a dielectric polymer, such as an epoxy-based polymer.

Although not shown, a second protection layer may be provided below the lowermost substrate wiring layer. The second protection layer may cover a bottom surface of the lowermost substrate wiring layer. The second protection layer may include a dielectric material. For example, the second protection layer may include a dielectric polymer or a photosensitive polymer.

The second protection layer may have fourth substrate pads electrically connected to the tail portion (or, the third substrate pads 126 and the fourth substrate pads 128) of the substrate wiring pattern 120 in a substrate wiring layer that is immediately disposed on the second protection layer. The fourth substrate pads may be buried in the second protection layer. The fourth substrate pads may be exposed on top and bottom surfaces of the second protection layer. The following description will focus on the embodiment of FIG. 1.

The power module 200 may be disposed on the package substrate 100. The package substrate 100 may be provided on a top surface 100*a* of the package substrate 100 with the power module 200 disposed on the central region CR of the package substrate 100. The power module 200 may be a module for providing power and ground to a semiconductor chip 500 which will be discussed below. For example, in some embodiments, the power module 200 may include a power management integrated circuit (PMIC). In some embodiments, the power module 200 may include various electronic elements for driving the semiconductor chip 500. For example, the power module 200 may include a radio frequency integrated circuit (RFIC), or various electronic elements for driving the RFIC such as a modem, a transceiver, a power amplifier module (PAM), frequency filter, or a low noise amplifier (LNA).

The power module 200 may be disposed in a face-down position on the package substrate 100. For example, the power module 200 may have a front surface directed toward the package substrate 100 and a rear surface opposite to the front surface. In the description below, the term "front surface" may be defined to indicate a surface, or an active surface of an integrated circuit in a semiconductor chip or a module, on which are formed pads of the semiconductor chip or the module, and the term "rear surface" may be defined to indicate a surface opposite to the front surface. Based on positions of the package substrate 100 and the power module 200 illustrated in FIG. 1, a bottom surface of the power module 200 may correspond to the front surface of the power module 200, and a top surface of the power module 200 may correspond to the rear surface of the power module 200.

The power module 200 may have one or more module pads provided on the bottom surface of the power module 200. The module pads may be electrically connected to an integrated device or integrated circuits in the power module 200.

The power module 200 may be mounted on the package substrate 100. The power module 200 may be flip-chip mounted on the package substrate 100. For example, the front surface of the power module 200 may be directed toward the package substrate 100. In this configuration, module terminals 210 may be provided below the module pads of the power module 200. The power module 200 may be mounted to the package substrate 100 through the module terminals 210. In some embodiments, the module terminals 210 may be provided on the package substrate 100. The module terminals 210 may connect the module pads of the power module 200 to the first substrate pads 122 of the package substrate 100. Differently from that shown, in some embodiments, the power module 200 may be wire-bonded to the package substrate 100. For example, the power module 200 may be provided in a face-up position on the package substrate 100 such that the front surface of the power module 200 corresponds to a top surface of the power module 200 to allow the module pads to face upwardly, and may be electrically connected to the package substrate 100 through bonding wires that connect the module pads of the power module 200 to the first substrate pads 122 of the package substrate 100.

At least one connector 300 may be disposed on the package substrate 100. The package substrate 100 may be provided on the top surface 100a of the package substrate 100 with the connector 300 disposed on the peripheral region PR of the package substrate 100. The connector 300 may be a module for allowing a semiconductor package to transceive external signals. For example, in some embodiments, the connector 300 may be a socket to which an external cable 350 is coupled. In some embodiments, the connector 300 may be a socket or pad to which are coupled pins, lead frames, or bumps of an external device.

The connector 300 may be disposed in a face-down position on the package substrate 100. For example, the connector 300 may have a front surface which faces the package substrate 100 and on which pads or wires are provided, and may also have a rear surface which stands opposite to the package substrate 100 and has a coupling part to which the external cable 350 or an external device is coupled.

The connector 300 may have one or more connector pads provided on a bottom surface thereof. The connector pads may be electrically connected to an integrated device or integrated circuits in the connector 300.

The connector 300 may be mounted on the package substrate 100. The connector 300 may be flip-chip mounted on the package substrate 100. For example, the front surface of the connector 300 may be directed toward the package substrate 100. In this configuration, connector terminals 310 may be provided below the connector pads of the connector 300. The connector 300 may be mounted to the package substrate 100 through the connector terminals 310. In some embodiments, the connector terminals 310 may be provided on the package substrate 100. The connector terminals 310 may connect the connector pads of the connector 300 to the second substrate pads 124 of the package substrate 100. Differently from that shown, in some embodiments, the connector 300 may be wire-bonded to the package substrate 100. For example, the connector 300 may be provided on a rear surface of the connector 300 with the connector pads spaced apart from the coupling part, and may be electrically connected to the package substrate 100 through bonding wires that connect the connector pads of the connector 300 to the second substrate pads 124 of the package substrate 100.

According to some embodiments, since the connector 300 and the power module 200 are all coupled to one package substrate 100, there may be a reduced electrical path through which power module 200 receives an outer power or signal. Accordingly, the semiconductor package according to some embodiments may improve in electrical properties.

Referring still to FIG. 1, a connection substrate 400 may be disposed on a bottom surface 100b of the package substrate 100. The connection substrate 400 may have an opening 402 that penetrates therethrough. For example, the opening 402 may be shaped like an open hole that connects top and bottom surfaces of the connection substrate 400. The opening 402 may be positioned on the central region CR of the package substrate 100. The top surface of the connection substrate 400 may be in contact with the bottom surface 100b of the package substrate 100. The connection substrate 400 may correspond to a vertical connection terminal connected to the package substrate 100 on one side of the semiconductor chip 500 which will be discussed below.

The connection substrate 400 may include a base layer 410 and a conductive member 420 that is a wiring pattern provided in the base layer 410. The base layer 410 may include, for example, silicon oxide (SiO). The connective member 420 may be disposed closer than the opening 402 to an outer side of the connection substrate 400. In other words, the connective member 420 may be disposed lateral to the opening 402, between the opening 402 and the outer side of the connection substrate 400.

The conductive member 420 may include upper pads 422, vias 424, and lower pads 426. The upper pads 422 may be disposed on an upper portion of the connection substrate 400. The upper pads 422 may be exposed on the top surface of the connection substrate 400. The upper pads 422 may be electrically connected to the third substrate pads 126 of the package substrate 100. For example, the upper pads 422 of the connection substrate 400 may be in contact with the package substrate 100 and may be coupled to the third substrate pads 126 of the package substrate 100. The lower pads 426 may be disposed on the bottom surface of the connection substrate 400. The vias 424 may penetrate the base layer 410 and may electrically connect the upper pads 422 to the lower pads 426.

FIG. 1 depicts that the upper pads 422 of the connection substrate 400 are directly coupled to the third substrate pads 126 of the package substrate 100, but embodiments are not limited thereto. Terminals such as solder balls or solder bumps provided on the upper pads 422 may be used to mount the connection substrate 400 on the third substrate pads 126 of the package substrate 100. The following description will focus on the embodiment of FIG. 1.

At least one semiconductor chip 500 may be disposed on the bottom surface 100b of the package substrate 100. The semiconductor chip 500 may be disposed in the opening 402 of the connection substrate 400. When viewed in plan, the semiconductor chip 500 may have a planar shape smaller than a planar shape of the opening 402. For example, the semiconductor chip 500 may be spaced apart from an inner wall of the opening 402. When viewed in plan, the semiconductor chip 500 may be positioned on the central region CR of the package substrate 100. In this configuration, at least a portion of the semiconductor chip 500 may vertically overlap the power module 200. The semiconductor chip 500 may be provided in a face-down position. The semiconductor chip 500 may have a top surface 500a directed toward the package substrate 100 and a bottom surface 500b opposite to the top surface 500a. The top surface 500a may be an active surface of the semiconductor chip 500. The bottom surface 500b may be an inactive surface of the semiconductor chip 500. The top surface 500a of the semiconductor chip 500 may be in contact with the bottom surface 100b of the package substrate 100. The bottom surface 500b of the semiconductor chip 500 may be located at substantially the same level as a level of the bottom surface of the connection substrate 400. Embodiments, however, are not limited thereto, and the bottom surface 500b of the semiconductor chip 500 may be located at a level higher or lower than the level of the bottom surface of the connection substrate 400. In some embodiments, the semiconductor chip 500 may be an application processor (AP) chip. For example, the semiconductor chip 500 may be a composite chip including a logic die and a memory die.

The semiconductor chip 500 may include chip pads 510 disposed on an upper portion thereof. The chip pads 510 may be electrically connected to the fourth substrate pads 128 of the package substrate 100. For example, the chip pads 510 of the semiconductor chip 500 may be in contact with the package substrate 100 and coupled to the fourth substrate pads 128 of the package substrate 100. The semiconductor chip 500 may be connected through the package substrate 100 to the power module 200 and the connector 300.

According to some embodiments, since the power module 200, the connector 300, and the semiconductor chip 500 may all be coupled to one package substrate 100, a semiconductor package may have short paths for electrical connection. In addition, since the power module 200 and the semiconductor chip 500 are respectively disposed on the top surface 100a and the bottom surface 100b of the package substrate 100 so as to vertically overlap each other, the package substrate 100 may have therein a minimized horizontal electrical path between the power module 200 and the semiconductor chip 500 Therefore, the electrical path may be excessively short between the power module 200 and the semiconductor chip 500, and the semiconductor package according to some embodiments may increase in electrical properties. Furthermore, opposite surfaces of the package substrate 100 may be used as areas for mounting devices, and in particular, one package substrate 100 may be provided thereon with the semiconductor chip 500, the connector 300 for external connection, and the power module 200 for power supply, with the result that the semiconductor package according to some embodiments may provide a compact-sized semiconductor package.

A dielectric layer 600 may be disposed on the bottom surface 100b of the package substrate 100. In the opening 402, the dielectric layer 600 may fill a space between the connection substrate 400 and the semiconductor chip 500. An uppermost surface of the dielectric layer 600 may be in contact with the bottom surface 100b of the package substrate 100. In this configuration, the uppermost surface of the dielectric layer 600 may be located at a level the same as a level of the top surface of the connection substrate 400 and a level of the top surface 500a of the semiconductor chip 500. A bottom surface of the dielectric layer 600 may be located at a level the same as a level of the bottom surface of the connection substrate 400 and a level of the bottom surface 500b of the semiconductor chip 500. The dielectric layer 600 may expose the bottom surface 500b of the semiconductor chip 500. The dielectric layer 600 may include a dielectric material. For example, the dielectric layer 600 may include an epoxy molding compound (EMC).

FIG. 1 depicts that the connection substrate 400 is provided on the bottom surface 100b of the package substrate 100, but embodiments are not limited thereto. As illustrated in FIG. 2, in some embodiments, a semiconductor package may include a connection substrate that replaces the base layer 410 and the conductive member 420 with the dielectric layer. In some embodiments, the connection structure 400 may be omitted.

Referring to FIG. 2, in some embodiments, the package substrate 100 may be provided on the bottom surface 100b of the package substrate 100 with the dielectric layer 600 that surrounds the semiconductor chip 500. That is, the dielectric layer 600 may have an outer lateral surface that is coplanar with an outer lateral surface of the package substrate 100. The dielectric layer 600 may expose the bottom surface 500b of the semiconductor chip 500.

In this configuration, the semiconductor package may include a through electrode 610. The through electrode 610 may be disposed horizontally spaced apart from the semiconductor chip 500. For example, the through electrode 610 may correspond to a vertical connection terminal connected to the package substrate 100 on one side of the semiconductor chip 500. The through electrode 610 may be disposed between the semiconductor chip 500 and the outer lateral surface of the dielectric layer 600. The through electrode 610 may vertically penetrate the dielectric layer 600. The through electrode 610 may be coupled to the third substrate pads 126 of the package substrate 100. The through electrode 610 may include a metal pillar. Although not shown, the through electrode 610 may have a width that increases with increasing distance from the package substrate 100.

Although not shown, a seed/barrier layer may be provided between the through electrode 610 and the dielectric layer 600. For example, the seed/barrier layer may cover a bottom or lateral surface of the through electrode 610.

Referring back to FIG. 1, a heat radiator 700 may be provided on the connection substrate 400 and the semiconductor chip 500. For example, the heat radiator 700 may be disposed in contact with the bottom surface of the connection substrate 400 and the bottom surface 500b of the semiconductor chip 500. The heat radiator 700 may include a heat sink. The heat radiator 700 may outwardly discharge heat generated from the semiconductor chip 500. Referring back to FIG. 2, in the configuration in which the connection structure is omitted, the heat radiator 700 may be provided on the dielectric layer 600 and the semiconductor chip 500. In some embodiments, the heat radiator 700 may be omitted.

The heat radiator 700 may be attached through an adhesive film 710 to the connection substrate 400 and the semiconductor chip 500, or as illustrated in the embodiment of FIG. 2, the heat radiator may be attached through the adhesive film 710 to the dielectric layer 600 and the semiconductor chip 500. For example, the adhesive film 710 may cover the bottom surface of the connection substrate 400 and the bottom surface 500b of the semiconductor chip 500. In this configuration, the lower pads 426 of the connection substrate 400 may be buried in the adhesive film 710. In some embodiments, the adhesive film 710 may be omitted on the semiconductor chip 500. As illustrated in FIG. 3, in some embodiments, the heat radiator 700 may be attached by the adhesive film 710 to the connection substrate 400 and directly coupled to the bottom surface 500b of the semiconductor chip 500. In other words, in some embodiments, the adhesive film 710 may not be provided between the connection substrate and the bottom surface 500b of the semiconductor chip 500 such that the heat radiator 700 is directly coupled to the bottom surface 500b of the semiconductor chip 500. The adhesive film 710 may include a thermal interface material (TIM) such as thermal grease.

According to some embodiments, because the power module 200 and the connector 300 are provided on the top surface 100a of the package substrate 100, and because the semiconductor chip 500 is provided on the bottom surface 100b of the package substrate 100, the semiconductor package may be coupled to an external device through the connector 300, without being mounted on a separate substrate. Therefore, the heat radiator 700 may be provided on the rear surface (corresponding to the bottom surface 500b in the embodiment of FIG. 1) of the semiconductor chip 500, and the semiconductor package according to some embodiments may increase in thermal radiation efficiency. Accordingly, the semiconductor package according to some embodiments may improve in operating stability.

Figure 4:
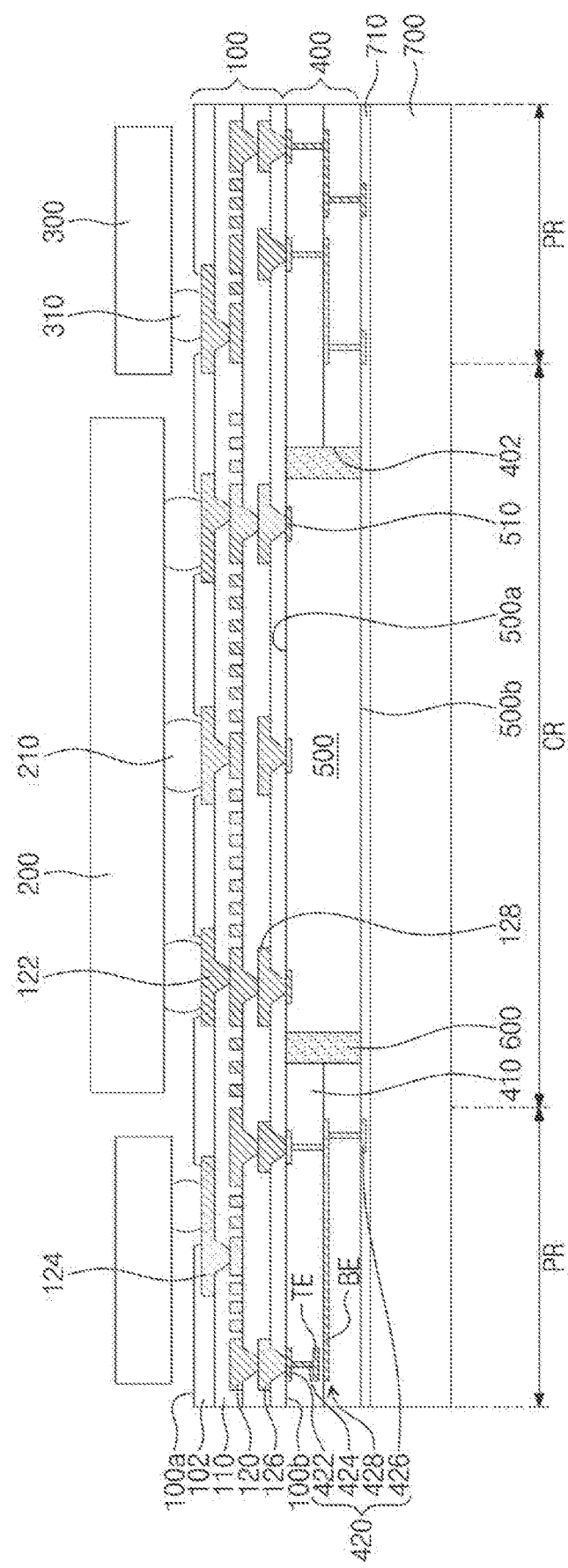
Figure 5:
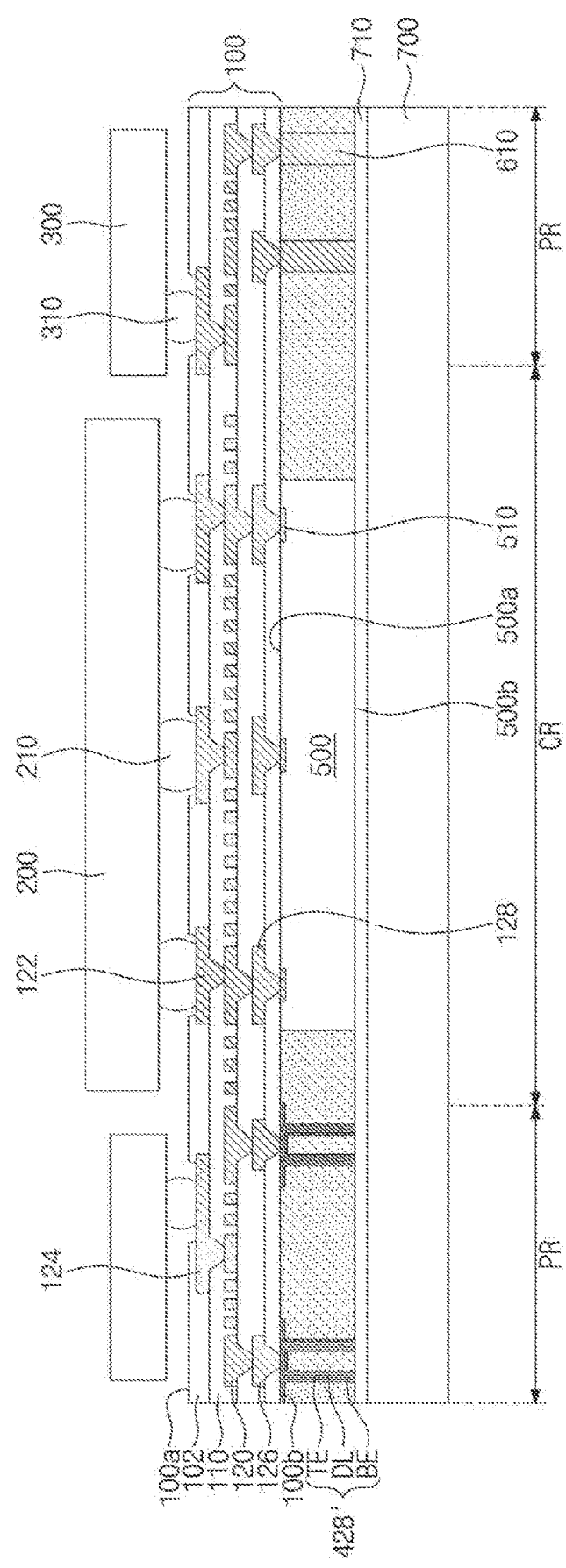
Figure 6:
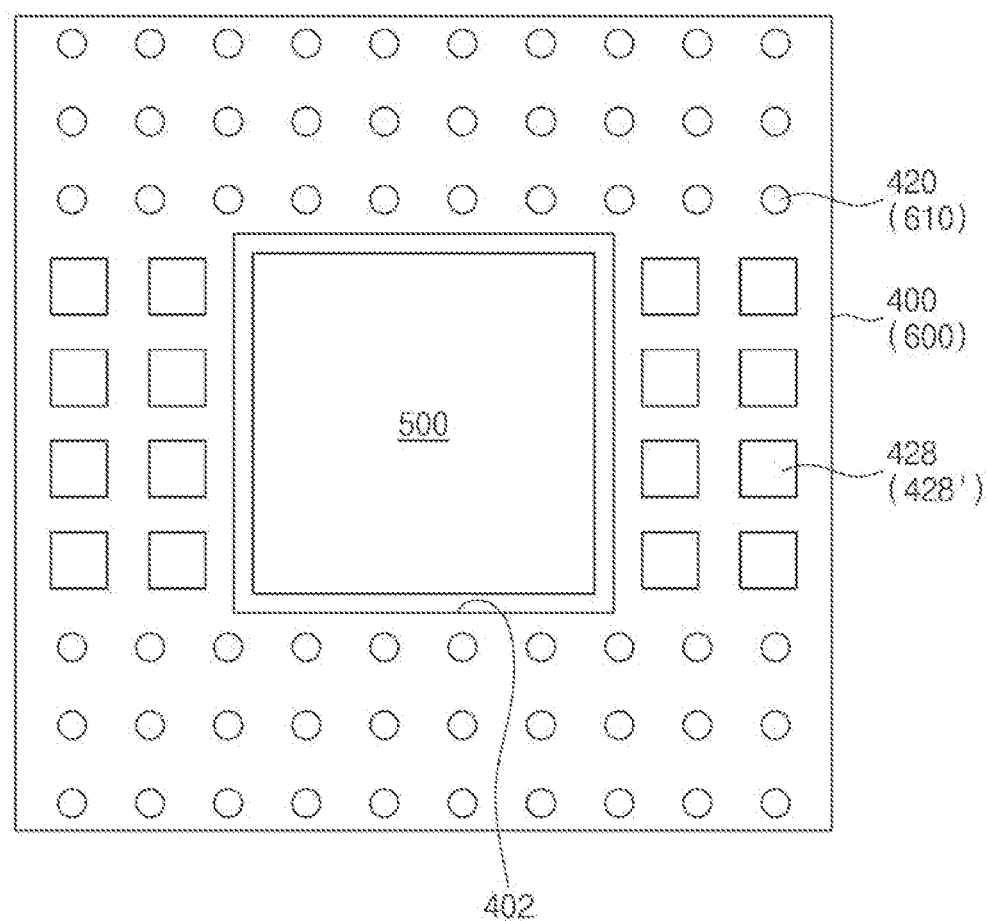
FIG. 6 illustrates a plan view showing a semiconductor package according to some embodiments.

FIGS. 4 and 5 illustrate cross-sectional views showing a semiconductor package according to some embodiments. FIG. 6 illustrates a plan view showing a semiconductor package according to some embodiments. In the embodiments that follow, components the same as those discussed with reference to FIGS. 1 to 3 are allocated the same reference numerals thereto, and a repetitive explanation thereof will be omitted or abridged for convenience and conciseness of description. The following description will focus on differences between the embodiments of FIGS. 1 to 3 and other embodiments discussed below.

Referring to FIG. 4, a connection substrate 400 may be disposed on the bottom surface 100b of the package substrate 100. The connection substrate 400 may have an opening 402 that penetrates therethrough. A bottom surface of the connection substrate 400 may be in contact with the bottom surface 100b of the package substrate 100.

The connection substrate 400 may include a base layer 410 and a conductive member 420 that is a wiring pattern provided in the base layer 410. The connective member 420 may be disposed closer than the opening 402 to an outer side of the connection substrate 400.

The conductive member 420 may include upper pads 422, vias 424, lower pads 426, and one or more passive elements 428. The upper pads 422 may be disposed on an upper portion of the connection substrate 400. The upper pads 422 may be electrically connected to the third substrate pads 126 of the package substrate 100. The lower pads 426 may be disposed on the bottom surface of the connection substrate 400. The vias 424 may penetrate the base layer 410 and may electrically connect the upper pads 422 to the lower pads 426.

The passive element 428 may be disposed on one side of the semiconductor chip 500. The passive element 428 may be disposed in the base layer 410. In some embodiments, the passive element 428 may be a capacitor. For example, the passive element 428 may have a top electrode TE and a bottom electrode BE. The top electrode TE and the bottom electrode BE may each be connected to a conductive pattern of the conductive member 420. For example, in some embodiments, one of the top and bottom electrodes TE and BE may be connected to one of the vias 424, and the other of the top and bottom electrodes TE and BE may be a portion of a horizontal line provided in the base layer 410. In some embodiments, the passive element 428 may be an inductor or a resistor. The passive element 428 may be connected to the semiconductor chip 500 through the conductive member 420 and the package substrate 100.

Similar to the embodiment of FIG. 2, a semiconductor package may omit the connection substrate 400. In this configuration, as illustrated in FIG. 5, one or more passive elements 428' may be disposed on one side of the semiconductor chip 500. The passive element 428' may be provided in the dielectric layer 600. The passive element 428' may include a top electrode TE', a bottom electrode BE', and a dielectric layer DL between the top and bottom electrodes TE and BE. In some embodiments, the top electrode TE' may have a hollow cup shape or a cup shape. In some embodiments, the top electrode TE' may have a cylindrical shape. The top electrode TE' may be coupled to the third substrate pads 126 of the package substrate 100. The package substrate 100 may be provided on the bottom surface 100b of the package substrate with the dielectric layer DL that conformally covers the top electrode TE'. The bottom electrode BE' may conformally cover the dielectric layer DL.

Referring to FIGS. 4 to 6, the semiconductor chip 500 may be provided on one side of the semiconductor chip 500 with an area on which are provided the through electrodes (see 610 of FIG. 5) or vertical lines of the connection substrate (see 400 of FIG. 4) for vertical connection, and may be provided on another side of the semiconductor chip 500 with an area on which are provided the passive elements 428 or 428' and are provided neither the through electrodes 610 nor vertical lines of the connection substrate 400.

According to some embodiments, the passive elements 428 or 428' may be provided on an empty area on which are provided neither the through electrodes 610 nor vertical lines of the connection substrate 400, and no separate electrical connection may be used for forming the passive elements 428 or 428'. Accordingly, a semiconductor package according to some embodiments may become compact-sized. In addition, since the passive element 428 or 428', the semiconductor chip 500, and the power module 200 are all mounted on one package substrate 100, a semiconductor package according to some embodiments may have short electrical paths therein.

Figure 7:
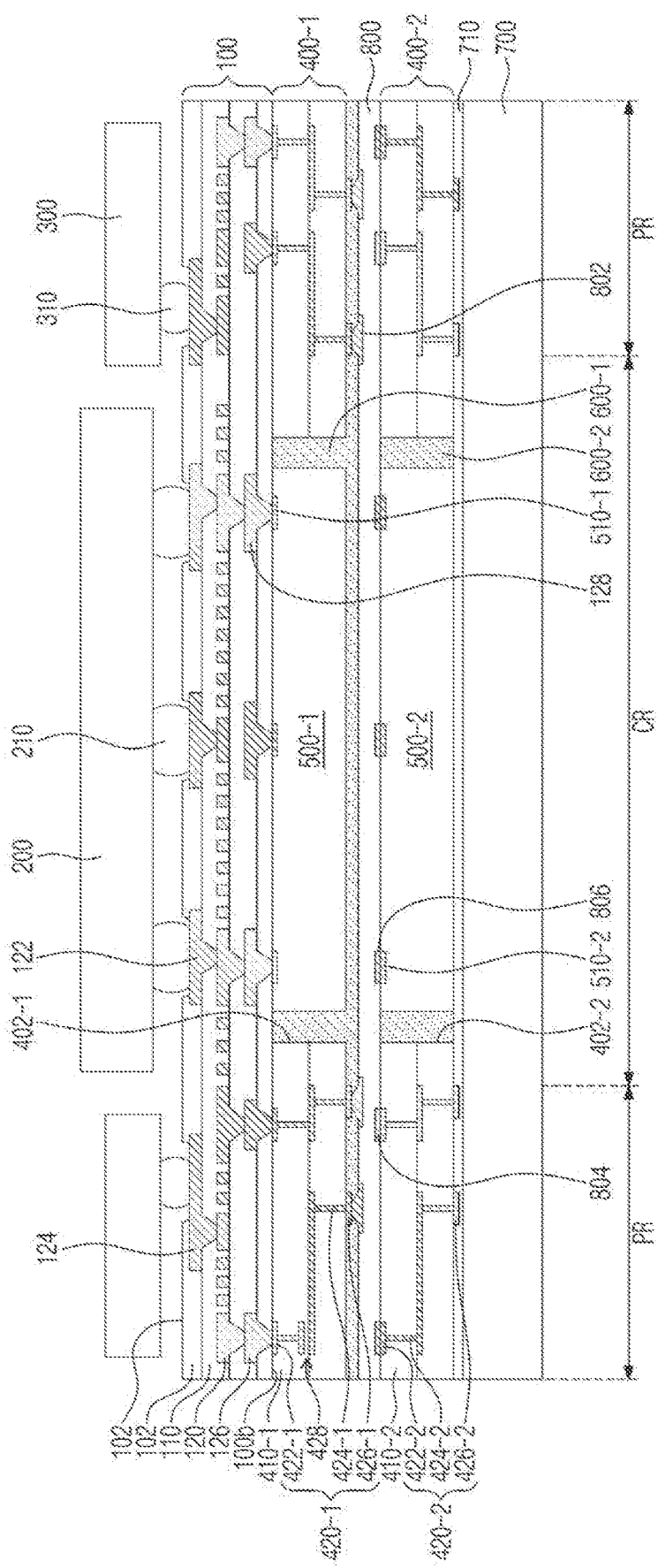
FIGS. 7 and 8 illustrate cross-sectional views showing a semiconductor package according to some embodiments.
Figure 8:
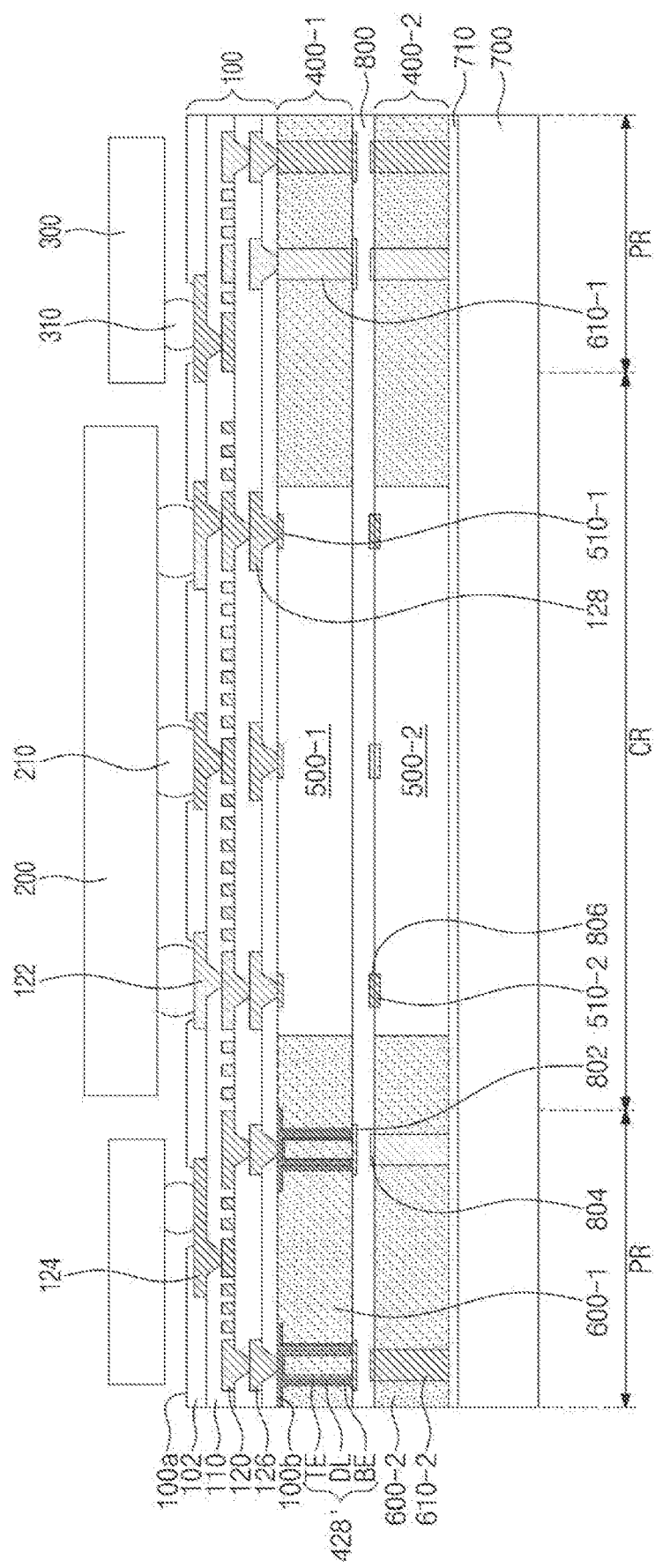

FIGS. 7 and 8 illustrate cross-sectional views showing a semiconductor package according to some embodiments.

Referring back to FIG. 7, a first connection substrate 400-1 may be disposed on the bottom surface 100b of the package substrate 100. The first connection substrate 400-1 may have a first opening 402-1 that penetrates therethrough. A top surface of the first connection substrate 400-1 may be in contact with the bottom surface 100b of the package substrate 100.

The first connection substrate 400-1 may have a configuration substantially the same as or similar to the configuration of the connection substrate 400 discussed with reference to FIGS. 1 to 6. The first connection substrate 400-1 may include a first base layer 410-1 and a first conductive member 420-1 that is a wiring pattern provided in the first base layer 410-1. The first conductive member 420-1 may be disposed closer than the first opening 402-1 to an outer side of the first connection substrate 400-1.

The first conductive member 420-1 may include first upper pads 422-1, first vias 424-1, first lower pads 426-1, and one or more passive elements 428. The first upper pads 422-1 may be disposed on an upper portion of the first connection substrate 400-1. The first upper pads 422-1 may be electrically connected to the third substrate pads 126 of the package substrate 100. The first lower pads 426-1 may be disposed on a bottom surface of the first connection substrate 400-1. The first through vias 424-1 may penetrate the first base layer 410-1, and may electrically connect the first upper pads 422-1 to the first lower pads 426-1. The passive element 428 may be disposed in the first base layer 410-1.

At least one first semiconductor chip 500-1 may be disposed on the bottom surface 100*b* of the package substrate 100. The first semiconductor chip 500-1 may have a configuration substantially the same as or similar to the configuration of the semiconductor chip 500 discussed with reference to FIGS. 1 to 6. The first semiconductor chip 500-1 may be disposed in the first opening 402-1 of the first connection substrate 400-1. The first semiconductor chip 500-1 may include first chip pads 510-1 disposed on an upper portion thereof. The first chip pads 510-1 may be electrically connected to the fourth substrate pads 128 of the package substrate 100.

A first dielectric layer 600-1 may be disposed on the bottom surface 100*b* of the package substrate 100. The first dielectric layer 600-1 may fill a space between the first connection substrate 400-1 and the first semiconductor chip 500-1. In some embodiments, the first dielectric layer 600-1 may cover the bottom surface of the first connection substrate 400-1 and a bottom surface of the first semiconductor chip 500-1. In some embodiments, a bottom surface of the first dielectric layer 600-1 may be located at the same level as a level of the bottom surface of the first connection substrate 400-1 and a level of the bottom surface of the first semiconductor chip 500-1.

A wiring layer 800 may be provided on the first connection substrate 400-1 and the first semiconductor chip 500-1. For example, the wiring layer 800 may be disposed to contact the bottom surface of the first dielectric layer 600-1. When the bottom surface of the first dielectric layer 600-1 is located at the same level as a level of the bottom surface of the first connection substrate 400-1 and a level of the bottom surface of the first semiconductor chip 500-1, the wiring layer 800 may be disposed to contact the bottom surface of the first connection substrate 400-1 and the bottom surface of the first semiconductor chip 500-1.

The wiring layer 800 may have first intermediate pads 802 provided on a top surface of the wiring layer 800, and may also have second intermediate pads 804 and third intermediate pads 806 provided on a bottom surface of the wiring layer 800. The first intermediate pads 802 may penetrate the first dielectric layer 600-1 to be coupled to the first lower pads 426-1 of the first connection substrate 400-1. The second intermediate pads 804 may be disposed on the peripheral region PR on the bottom surface of the wiring layer 800, and the third intermediate pads 806 may be disposed on the central region CR on the bottom surface of the wiring layer 800. The second intermediate pads 804 may correspond to pads on which a second connection substrate 400-2 is mounted as discussed below, and the third intermediate pads 806 may correspond to pads on which a second semiconductor chip 500-2 is mounted as discussed below.

A second connection substrate 400-2 may be disposed on the bottom surface of the wiring layer 800. The second connection substrate 400-2 may have a second opening 402-2 that penetrates therethrough. A top surface of the second connection substrate 400-2 may be in contact with the bottom surface of the wiring layer 800.

The second connection substrate 400-2 may have a configuration similar to a configuration of the first connection substrate 400-1. The second connection substrate 400-2 may include a second base layer 410-2 and a second conductive member 420-2 that is a wiring pattern provided in the second base layer 410-2. The second conductive member 420-2 may be disposed closer than the second opening 402-2 to an outer side of the second connection substrate 400-2. The second conductive member 420-2 may correspond to a dummy pattern that transfers heat from the first semiconductor chip 500-1 to a heat radiator 700 which will be discussed below.

The second conductive member 420-2 may include second upper pads 422-2, second through vias 424-2, and second lower pads 426-2. The second upper pads 422-2 may be disposed on an upper portion of the second connection substrate 400-2. The second upper pads 422-2 may be electrically connected to the second intermediate pads 804 of the wiring layer 800. The second lower pads 426-2 may be disposed on a bottom surface of the second connection substrate 400-2. The second through vias 424-2 may penetrate the second base layer 410-2, and may electrically connect the second upper pads 422-2 to the second lower pads 426-2.

At least one second semiconductor chip 500-2 may be disposed on the bottom surface of the wiring layer 800. The second semiconductor chip 500-2 may have a configuration similar to the configuration of the first semiconductor chip 500-1. The second semiconductor chip 500-2 may be disposed in the second opening 402-2 of the second connection substrate 400-2. The second semiconductor chip 500-2 may include second chip pads 510-2 disposed on an upper portion thereof. The second chip pads 510-2 may be electrically connected to the third intermediate pads 806 of the wiring layer 800.

A second dielectric layer 600-2 may be disposed on the bottom surface of the wiring layer 800. The second dielectric layer 600-2 may fill a space between the second connection substrate 400-2 and the second semiconductor chip 500-2. A bottom surface of the second dielectric layer 600-2 may be located at the same level as a level of the bottom surface of the second connection substrate 400-2 and a level of a bottom surface of the second semiconductor chip 500-2. The second dielectric layer 600-2 may expose the bottom surface of the second semiconductor chip 500-2.

A heat radiator 700 may be provided on the second connection substrate 400-2 and the second semiconductor chip 500-2. For example, the heat radiator 700 may be disposed in contact with the bottom surface of the second connection substrate 400-2 and the bottom surface of the second semiconductor chip 500-2. In such a configuration, the wiring layer 800 may be positioned between the heat radiator 700 and both of the first connection substrate 400-1 and the first semiconductor chip 500-1, and the second connection substrate 400-2 and the second semiconductor chip 500-2 may be positioned between the wiring layer 800 and the heat radiator 700. The heat radiator 700 may include a heat sink. The heat radiator 700 may outwardly discharge heat generated from the second semiconductor chip 500-2 or the first and second semiconductor chips 500-1 and 500-2. In some embodiments, the heat radiator 700 may be omitted.

FIG. 7 depicts that the package substrate 100 is provided on the bottom surface 100*b* of the package substrate 100 with the first connection substrate 400-1 and the second connection substrate 400-2, but embodiments are not limited thereto. As illustrated in FIG. 8, a semiconductor package may include no connection substrates.

Referring to FIG. 8, the package substrate 100 may be provided on the bottom surface 100*b* of the package substrate 100 with a first dielectric layer 600-1 that surrounds the first semiconductor chip 500-1. The first dielectric layer 600-1 may expose a bottom surface of the first semiconductor chip 500-1.

A semiconductor package may include a first through electrode 610-1. The first through electrode 610-1 may be disposed between the first semiconductor chip 500-1 and an outer lateral surface of the first dielectric layer 600-1. The first through electrode 610-1 may vertically penetrate the first dielectric layer 600-1. The first through electrode 610-1 may be coupled to the third substrate pads 126 of the package substrate 100 and to the first intermediate pads 802 of the wiring layer 800.

One or more passive elements 428' may be disposed on one side of the first semiconductor chip 500-1. The passive element 428' may be provided in the first dielectric layer 600-1. The passive element 428' may include a top electrode TE, a bottom electrode BE, and a dielectric layer DL between the top and bottom electrodes TE and BE.

The wiring layer 800 may be provided on a bottom surface of the wiring layer 800 with a second dielectric layer 600-2 that surrounds the second semiconductor chip 500-2. The second dielectric layer 600-2 may expose a bottom surface of the second semiconductor chip 500-2.

A semiconductor package may include a second through electrode 610-2. The second through electrode 610-2 may be disposed between the second semiconductor chip 500-2 and an outer lateral surface of the second dielectric layer 600-2. The second through electrode 610-2 may vertically penetrate the second dielectric layer 600-2. The second through electrode 610-2 may be coupled to the second intermediate pads 804 of the wiring layer 800. The second through electrode 610-2 may be a vertical dummy terminal that transfers heat from the first semiconductor chip 500-1 to the heat radiator 700.

According to some embodiments, opposite surfaces of the package substrate 100 may be used as element mounting areas, and the semiconductor chips 500-1 and 500-2 may be stacked on one surface of the package substrate 100. In addition, the passive elements 428 or 428' may be formed by using wiring lines in the connection substrates 400-1 and 400-2 for vertical connection of the semiconductor chips 500-1 and 500-2. In this configuration, a semiconductor package according to some embodiments may be possible to provide a compact-sized semiconductor package having high integration.

Figure 9:
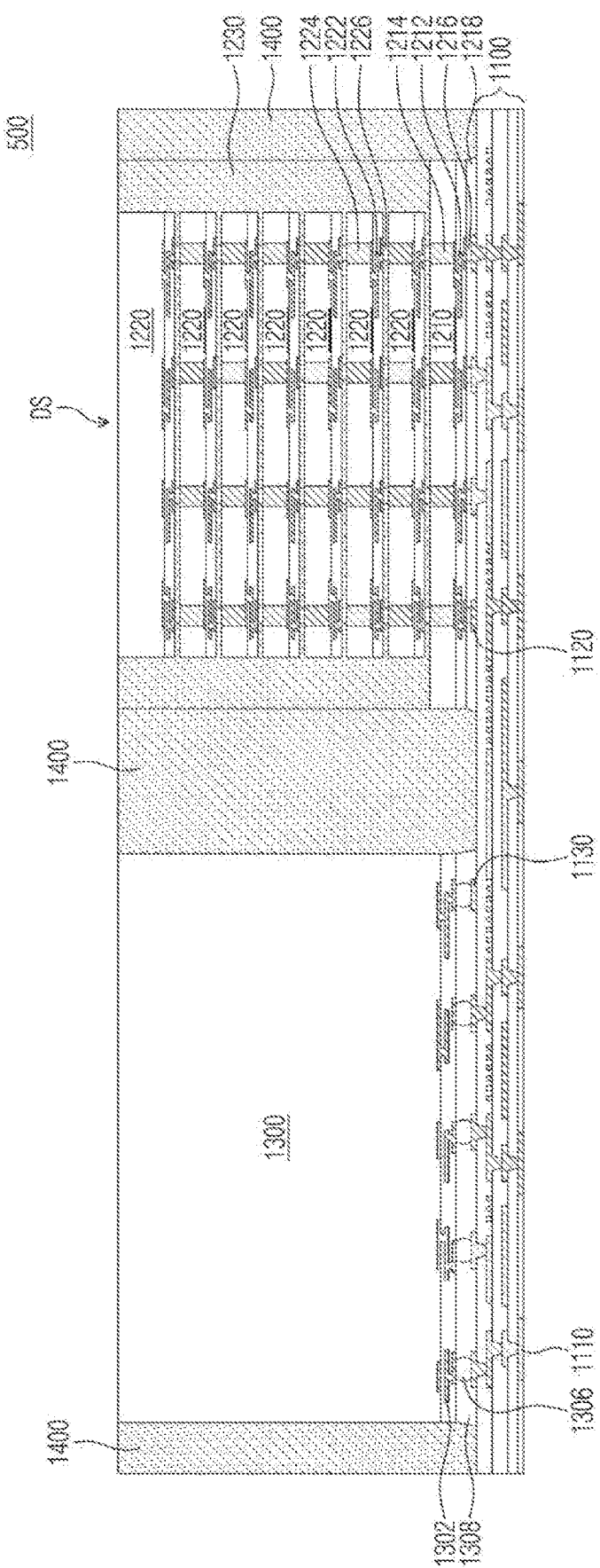
FIG. 9 illustrates a cross-sectional view showing a semiconductor chip of a semiconductor package according to some embodiments.
Figure 10:
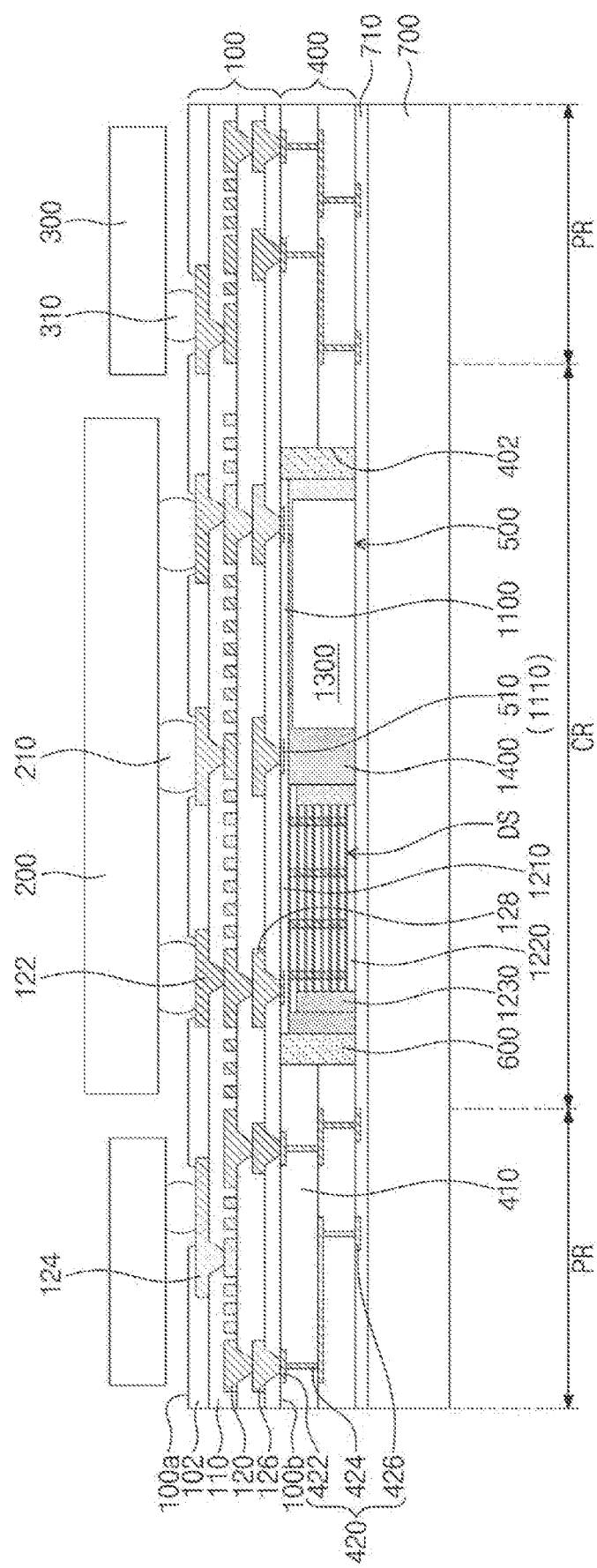
FIGS. 10 to 14 illustrate cross-sectional views showing a semiconductor package according to some embodiments.

FIG. 9 illustrates a cross-sectional view showing a semiconductor chip of a semiconductor package according to some embodiments. FIG. 10 illustrates a cross-sectional view showing a semiconductor package according to some embodiments.

Referring to FIGS. 9 and 10, a semiconductor chip 500 may be a composite chip including a logic die and a memory die. For example, the semiconductor chip 500 may be a chip including stacked dies. The following will describe in detail an example of the semiconductor chip 500. The semiconductor chip 500 discussed with reference to FIG. 9 is merely an illustrative example of the semiconductor chip 500 according to some embodiments, and the semiconductor chip 500 included in a semiconductor package according to various embodiments is not limited to the semiconductor chip 500 discussed with reference to FIG. 9.

A chip interposer 1100 may be provided. The chip interposer 1100 may include at least two wiring layers. For example, there may be provided wiring layers that are stacked on each other. Each of the wiring layers may include a dielectric pattern and a wiring pattern buried in the dielectric pattern. A lowermost one of the wiring layers may have first interposer pads 1110 electrically connected to the wiring layers. The first interposer pads 1110 may correspond to the chip pads 510 of the semiconductor chip 500 discussed with reference to FIGS. 1 to 6. The first interposer pads 1110 may be exposed on a bottom surface of the chip interposer 1100. An uppermost one of the wiring layers may have second interposer pads 1120 and third interposer pads 1130 electrically connected to the wiring layers. The second interposer pads 1120 and the third interposer pads 1130 may be exposed on a top surface of the chip interposer 1100. The second interposer pads 1120 may be pads on which is mounted a die stack DS which will be discussed below, and the third interposer pads 1130 may be pads on which is mounted a second die 1300 which will be discussed below.

A die stack DS may be disposed on the chip interposer 1100. The die stack DS may include a base substrate, first dies 1220 stacked on the base substrate, and a first molding layer 1230 that surrounds the first dies 1220. The following will describe in detail a configuration of the die stack DS.

The base substrate may be a base die 1210. For example, the base substrate may be a wafer-level semiconductor substrate formed of a semiconductor material, such as silicon (Si). In this description below, the base die 1210 and the base substrate may indicate the same component and may be allocated with the same reference numeral.

The base die 1210 may include a base circuit layer 1212 and base through vias 1214. The base circuit layer 1212 may be provided on a bottom surface of the base die 1210. The base circuit layer 1212 may include an integrated circuit. For example, the base circuit layer 1212 may be a memory circuit. For more detail, the base die 1210 may be a memory chip, such as dynamic random access memory (DRAM), static random access memory (SRAM), magnetic random access memory (MRAM), or Flash memory. The base through vias 1214 may penetrate the base die 1210 in a direction perpendicular to a top surface of the base die 1210. The base through vias 1214 may be electrically connected to the base circuit layer 1212. The bottom surface of the base die 1210 may be an active surface. FIG. 9 depicts that the base substrate includes the base die 1210, but embodiments are not limited thereto. According to some embodiments, the base substrate may not include the base die 1210. For example, the base substrate may be a plain substrate including no integrated circuit.

The base die 1210 may further include a protection layer and first connection terminals 1216. The protection layer may be disposed on the bottom surface of the base die 1210, covering the base circuit layer 1212. The protection layer may include silicon nitride (SiN). The first connection terminals 1216 may be provided on the bottom surface of the base die 1210. The first connection terminals 1216 may be electrically connected to an integrated circuit of the base circuit layer 1212. The first connection terminals 1216 may be exposed from the protection layer.

The first die 1220 may be mounted on the base die 1210. For example, the first die 1220 and the base die 1210 may constitute a chip-on-wafer (COW) structure. The first die 1220 may have a width less than a width of the base die 1210.

The first die 1220 may include a first circuit layer 1222 and first through vias 1224. The first circuit layer 1222 may include a memory circuit. For example, the first die 1220 may be a memory chip, such as dynamic random access memory (DRAM), static random access memory (SRAM), magnetic random access memory (MRAM), or Flash memory. The first circuit layer 1222 may include the same circuit as the circuit of the base circuit layer 1212, but the present inventive concepts are not limited thereto. The first through vias 1224 may penetrate the first die 1220 in a direction perpendicular to a top surface of the first die 1220. The first through vias 1224 may be electrically connected to the first circuit layer 1222. A bottom surface of the first die 1220 may be an active surface. The first die 1220 may be provided with die bumps 1226 on the bottom surface thereof. The die bumps 1226 may interpose between and electrically connect to each other the base die 1210 and the first die 1220.

The first die 1220 may be provided in plural. For example, a plurality of first dies 1220 may be stacked on the base die 1210. Eight to thirty two first dies 1220 may be stacked. The die bumps 1226 may be correspondingly provided on the first dies 1220. In this configuration, an uppermost first die 1220 may not include the first through vias 1224. In addition, the uppermost first die 1220 may have a thickness greater than those of other first dies 1220 that underlie the uppermost first die 1220.

Although not shown, an adhesive layer may be provided between the first dies 1220. The adhesive layer may include a non-conductive film (NCF). The adhesive layer may be interposed between the die bumps 1226 provided between the first dies 1220, thereby preventing an electrical short between the die bumps 1226.

The first molding layer 1230 may be disposed on the top surface of the base die 1210. The first molding layer 1230 may cover the base die 1210 and may surround the first dies 1220. A top surface of the first molding layer 1230 may be coplanar with a top surface of the uppermost first die 1220, and the uppermost first die 1220 may be exposed from the first molding layer 1230. The first molding layer 1230 may include a dielectric polymer material. For example, the first molding layer 1230 may include an epoxy molding compound (EMC).

The die stack DS may be provided as discussed above. The die stack DS may be mounted on the chip interposer 1100. For example, the die stack DS may be coupled through the first connection terminals 1216 of the base die 1210 to the second interposer pads 1120 of the chip interposer 1100. The first connection terminals 1216 may be provided between the base circuit layer 1212 and the second interposer pads 1120 of the chip interposer 1100.

A first under-fill layer 1218 may be provided between the chip interposer 1100 and the die stack DS. The first under-fill layer 1218 may surround the first connection terminals 1216, while filling a space between the chip interposer 1100 and the base die 1210.

A second die 1300 may be disposed on the chip interposer 1100. The second die 1300 may be disposed spaced apart from the die stack DS. The second die 1300 may have a thickness greater than thicknesses of the first dies 1220. The second die 1300 may include a semiconductor material, such as silicon (Si). The second die 1300 may include a second circuit layer 1302. The second circuit layer 1302 may include a logic circuit. For example, the second die 1300 may be a logic die. A bottom surface of the second die 1300 may be an active surface, and a top surface of the second die 1300 may be an inactive surface. The second die 1300 may be provided with second connection terminals 1306 on the bottom surface thereof. The second connection terminals 1306 may be electrically connected to an integrated circuit of the second circuit layer 1302.

The second die 1300 may be mounted on the chip interposer 1100. For example, the second die 1300 may be coupled through the second connection terminals 1306 to the third interposer pads 1130 of the chip interposer 1100. The second connection terminals 1306 may be provided between the second circuit layer 1302 and the third interposer pads 1130 of the chip interposer 1100.

A second under-fill layer 1308 may be provided between the chip interposer 1100 and the second die 1300. The second under-fill layer 1308 may surround the second connection terminals 1306, while filling a space between the chip interposer 1100 and the second die 1300.

A second molding layer 1400 may be provided on the chip interposer 1100. The second molding layer 1400 may cover the top surface of the chip interposer 1100. The second molding layer 1400 may surround the die stack DS and the second die 1300. The second molding layer 1400 may expose a top surface of the die stack DS and a top surface of the second die 1300. The second molding layer 1400 may include a dielectric material. For example, the second molding layer 1400 may include an epoxy molding compound (EMC).

As illustrated in FIG. 10, the semiconductor chip 500 may be mounted on the bottom surface 100b of the package substrate 100. For example, the semiconductor chip 500 may be in contact with the bottom surface 100b of the package substrate 100, and the first interposer pads 1110 of the chip interposer 1100 included in the semiconductor chip 500 may be coupled to the fourth substrate pads 128 of the package substrate 100.

A heat radiator 700 may be provided on the connection substrate 400 and the semiconductor chip 500. For example, the heat radiator 700 may be disposed to contact a bottom surface of the connection substrate 400 and a bottom surface of the semiconductor chip 500. For example, the heat radiator 700 may cover the second die 1300 and the die stack DS of the semiconductor chip 500, and in some embodiments may be attached through an adhesive film 710 to a rear surface of the die stack DS and a rear surface of the second die 1300.

Figure 11:
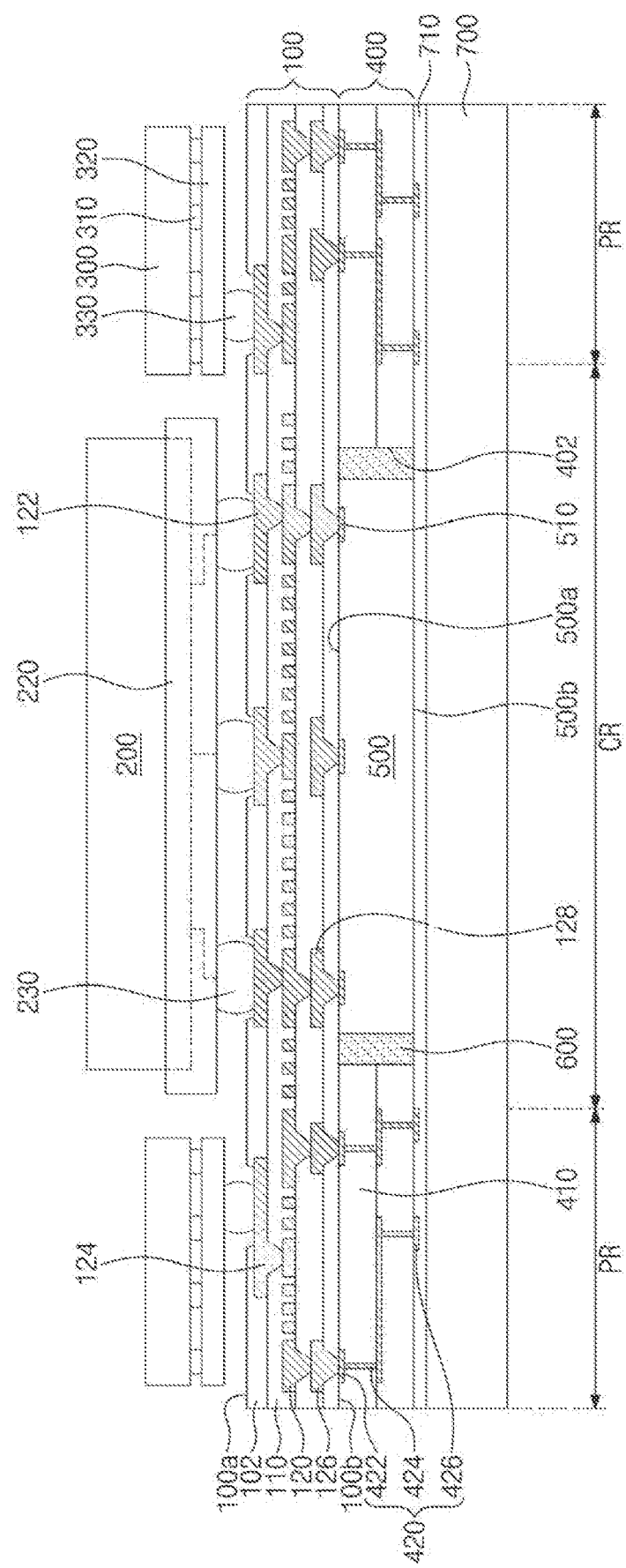

FIG. 11 illustrates a cross-sectional view showing a semiconductor package according to some embodiments.

Referring to FIG. 11, a module socket 220 may be disposed on the package substrate 100. The package substrate 100 may be provided on a top surface 100a of the package substrate with the module socket 220 that is disposed on the central region CR of the package substrate 100. The module socket 220 may be a socket to which the power module 200 is coupled. For example, the module socket 220 may have on an upper portion of the module socket 220 an insertion hole with which the power module 200 is engaged.

The module socket 220 may be mounted on the package substrate 100. The module socket 220 may be flip-chip mounted on the package substrate 100. The module socket 220 may be provided with socket terminals 230 thereunder. The module socket 220 may be mounted to the package substrate 100 through the socket terminals 230. In some embodiments, the socket terminals 230 may be provided on the package substrate 100. The socket terminals 230 may connect pads of the module socket 220 to the first substrate pads 122 of the package substrate 100. Differently from that shown in FIG. 11, the module socket 220 may be wire-bonded to the package substrate 100. For example, the module socket 220 may be provided on a top surface of the module socket 220 with pads that are spaced apart from the insertion hole, and may be electrically connected to the package substrate 100 through bonding wires that connect the pads of the module socket 220 to the second substrate pads 124 of the package substrate 100.

A power module 200 may be coupled to the module socket 220. For example, the power module 200 may be inserted into the insertion hole of the module socket 220 to electrically connect to the module socket 220. The power module 200 may be connected through the module socket 220 to the package substrate 100.

At least one interposer 320 may be disposed on the package substrate 100. The package substrate 100 may be provided on the top surface 100a of the package substrate 100 with the interposer 320 disposed on the peripheral region PR of the package substrate 100. The interposer 320 may redistribute connections of a connector 300 disposed thereon.

The interposer 320 may be mounted on the package substrate 100. The interposer 320 may be flip-chip mounted on the package substrate 100. For example, the interposer 320 may be provided with interposer terminals 330 thereunder. The interposer 320 may be mounted through the interposer terminals 330 to the package substrate 100. The interposer terminals 330 may connect pads of the interposer 320 to the second substrate pads 124 of the package substrate 100. Differently from that shown in FIG. 11, the interposer 320 may be wire-bonded to the package substrate 100.

At least one connector 300 may be disposed on the interposer 320. The connector 300 may be mounted on the interposer 320. The connector 300 may be flip-chip mounted on the interposer 320. For example, a front surface of the connector 300 may be directed toward the interposer 320. In this configuration, connector terminals 310 may be provided below connector pads of the connector 300. The connector 300 may be mounted to the interposer 320 through the connector terminals 310. In some embodiments, the connector terminals 310 may be provided on the interposer 320. Differently from that shown in FIG. 11, the connector 300 may be wire-bonded to the interposer 320.

According to various embodiments, a semiconductor package may be provided with one or both of the module socket 220 and the interposer 320.

Figure 12:
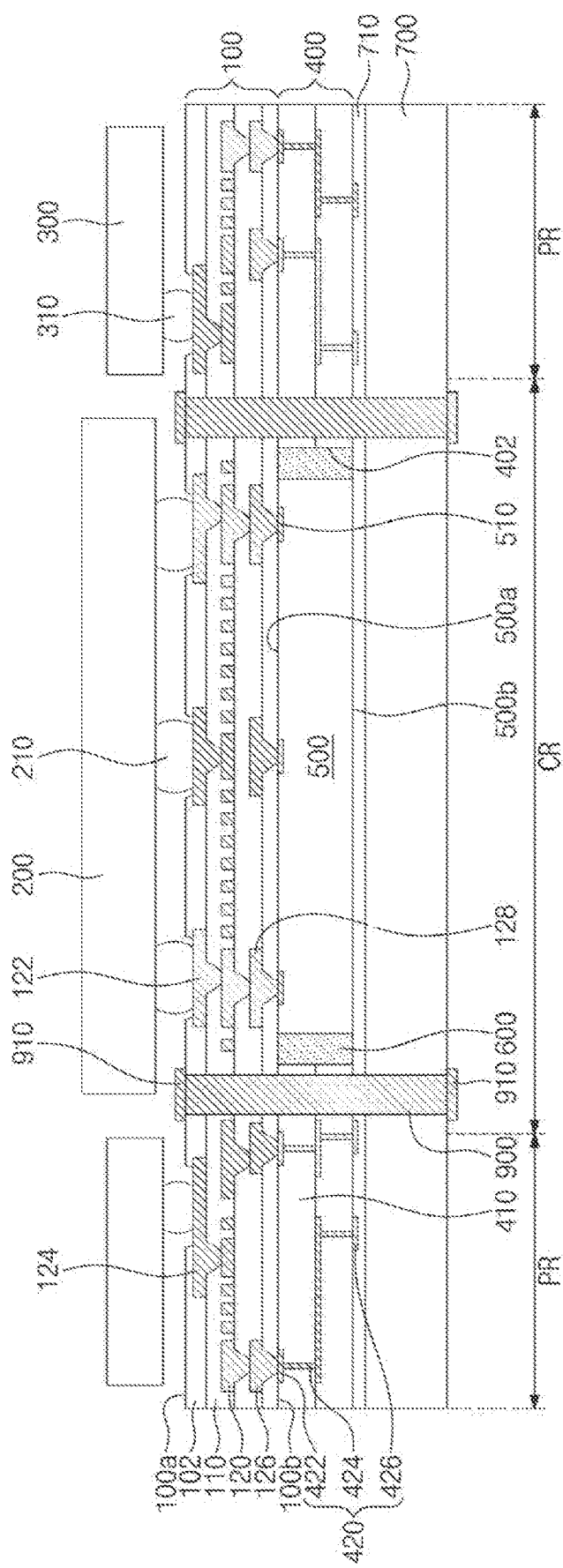

FIG. 12 illustrates a cross-sectional view showing a semiconductor package according to some embodiments.

Referring to FIG. 12, a semiconductor package may further include a fixing member 900. The fixing member 900 may vertically penetrate the package substrate 100, the connection substrate 400, and the heat radiator 700. The fixing member 900 may be connected to a fixing part 910 provided on the top surface 100a of the package substrate 100 and on a bottom surface of the heat radiator 700. The fixing part 910 may push the package substrate 100 and the heat radiator 700 against each other, and the fixing member 900 may fix the package substrate 100 and the heat radiator 700. For example, in some embodiments, the fixing member 900 may be a dielectric and the fixing part 910 may be a screw screwed into the dielectric.

According to some embodiments, the fixing member 900 may fix the package substrate 100, the connection substrate 400, and the heat radiator 700 that are vertically stacked. Therefore, a semiconductor package according to some embodiments may have improved structural stability. In addition, since the fixing member 900 pushes the heat radiator 700 against the semiconductor chip 500, a semiconductor package according to some embodiments may have increased efficiency of thermal radiation through the heat radiator 700 from the semiconductor chip 500.

Figure 13:
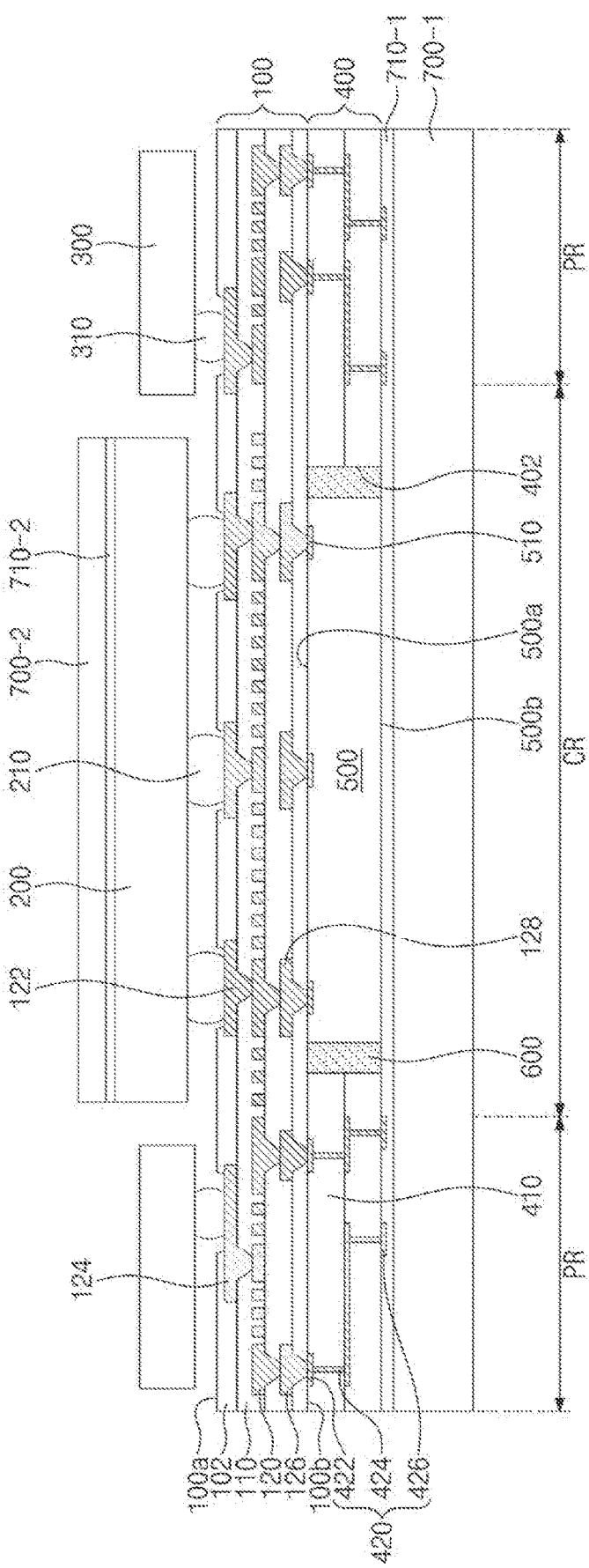

FIG. 13 illustrates a cross-sectional view showing a semiconductor package according to some embodiments.

Referring to FIG. 13, a first heat radiator 700-1 may be provided on the connection substrate 400 and the semiconductor chip 500. The first heat radiator 700-1 may be disposed to contact a bottom surface of the connection substrate 400 and a bottom surface 500b of the semiconductor chip 500. The first heat radiator 700-1 may be attached through a first adhesive film 710-1 to the connection substrate 400 and the semiconductor chip 500.

A semiconductor package may further include a second heat radiator 700-2. The second heat radiator 700-2 may be provided on a top surface of the power module 200. The second heat radiator 700-2 may be disposed to contact the top surface of the power module 200. The second heat radiator 700-2 may be attached through a second adhesive film 710-2 to the power module 200.

According to some embodiments, the first heat radiator 700-1 may be used to discharge heat generated from the semiconductor chip 500, and the second heat radiator 700-2 may be used to discharge heat generated from the power module 200. Therefore, a semiconductor package according to some embodiments may increase in thermal radiation efficiency and may improve in operating stability.

Figure 14:
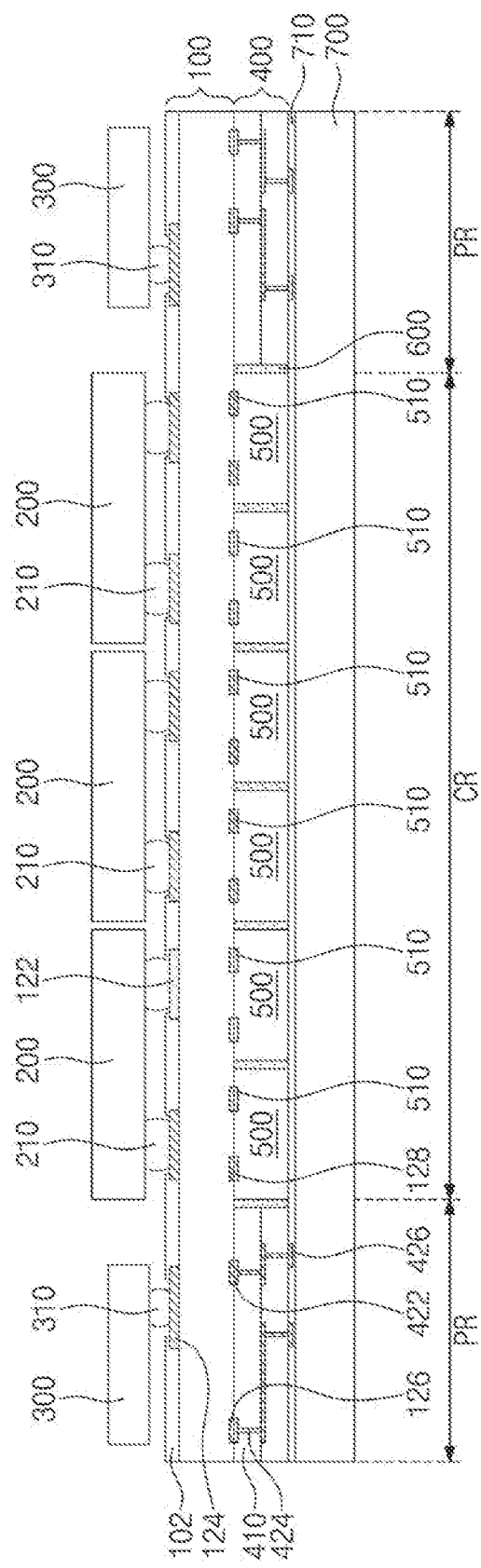
Figure 15:
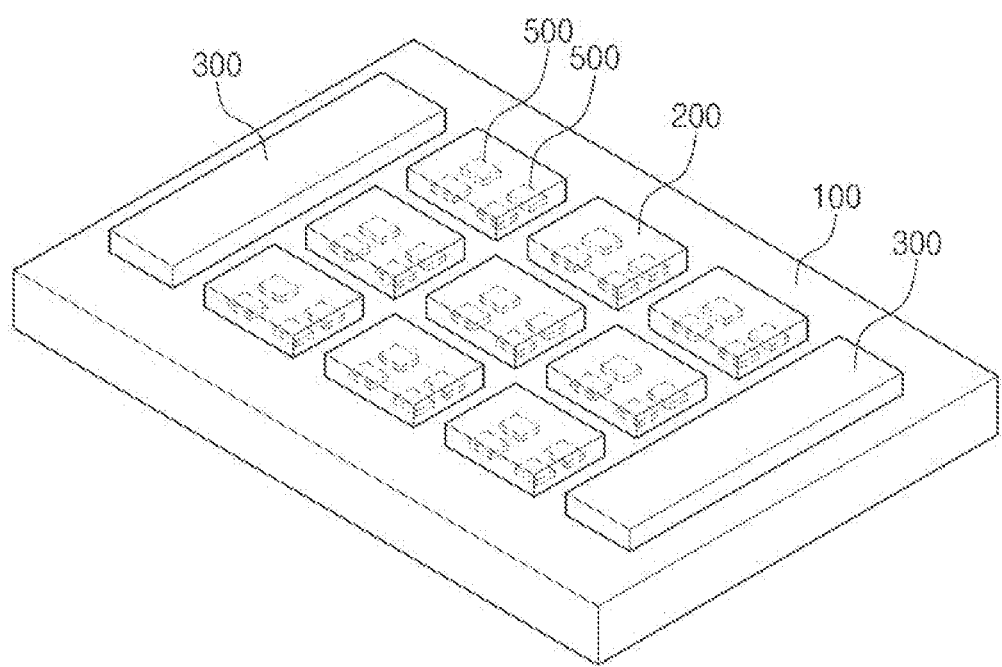
FIG. 15 illustrates a perspective view showing a semiconductor package according to some embodiments.

FIG. 14 illustrates a cross-sectional view showing a semiconductor package according to some embodiments. FIG. 15 illustrates a simplified perspective view of an arrangement between a package substrate, power modules, connectors, and semiconductor chips, showing a semiconductor package according to some embodiments.

Referring to FIGS. 14 and 15, there may be a plurality of power modules 200 and a plurality of connectors 300. The plurality of power modules 200 may be arranged in a plurality of rows and columns on the central region CR of the package substrate 100. The package substrate 100 may be provided with the plurality of connectors 300 on the peripheral region PR on either side of the central region CR. For example, the power modules 200 may be positioned between the connectors 300.

A plurality of semiconductor chips 500 may be provided. The plurality of semiconductor chips 500 may be disposed in the opening 402 of the connection substrate 400. In this configuration, an arrangement of the semiconductor chips 500 may correspond to an arrangement of the power modules 200. For example, a single power module 200 may vertically overlap at least two semiconductor chips 500. The single power module 200 and overlapping semiconductor chips 500 that overlap the single power module 200 may constitute a single tile. In accordance with the planar arrangement of the power modules 200, a plurality of tiles may also be arranged in a plurality of rows and columns on the central region CR of the package substrate 100. FIG. 15 depicts that the semiconductor chips 500 are arranged in a grid shape below one power module 200, but embodiments are not limited thereto. The semiconductor chips 500 may be arranged in a straight line or in various configurations below one power module 200.

FIGS. 16 to 23 illustrate cross-sectional views showing a method of fabricating a semiconductor package according to some embodiments.

Referring to FIG. 16, a connection substrate 400 may be provided. The connection substrate 400 may include a base layer 410 and a conductive member 420 that is a wiring pattern provided in the base layer 410. The conductive member 420 may include lower pads 426, vias 424, and upper pads 422. In this description of the method of fabricating the semiconductor package, the terms "lower" and "upper" may be defined to indicate positions of pads in a finally fabricated structure, and may be irrespective of positions of pads in intermediate processes.

An opening 402 may be formed in the connection substrate 400. A portion of the connection substrate 400 may be removed to form the opening that penetrates the connection substrate 400. For example, the opening 402 may be formed by performing an etching process, such as a drilling process, a laser ablation process, or a laser cutting process. The removed portion of the connection substrate 400 may be a zone where a semiconductor chip (see 500 of FIG. 17) is provided in a subsequent process.

The connection substrate 400 may be attached to a first carrier substrate 2000. For example, the first carrier substrate 2000 may be a conductive substrate including metal or a dielectric substrate including glass or polymer. The first carrier substrate 2000 may be attached to a bottom surface of the connection substrate 400 through an adhesive member 2010 provided on a top surface of the first carrier substrate 2000. For example, the adhesive member 2010 may include a glue tape.

Referring to FIG. 17, a semiconductor chip 500 may be provided on the first carrier substrate 2000. The semiconductor chip 500 may be provided in the opening 402 of the connection substrate 400. In this configuration, the semiconductor chip 500 may be disposed to allow an active surface 500a of the semiconductor chip 500 to face the first carrier substrate 2000.

A dielectric layer 600 may be formed on the first carrier substrate 2000. The dielectric layer 600 may be formed by coating a dielectric material on the connection substrate 400. The dielectric material may fill a space between the connection substrate 400 and the semiconductor chip 500. In addition, the dielectric material may cover a top surface of the connection substrate 400 and an inactive surface 500b of the semiconductor chip 500. The dielectric material may include a dielectric polymer, such as an epoxy molding compound (EMC).

Referring to FIG. 18, a second carrier substrate 2100 may be attached to the dielectric layer 600. For example, the second carrier substrate 2100 may be a conductive substrate including metal or a dielectric substrate including glass or polymer. The second carrier substrate 2100 may be attached to a top surface of the dielectric layer 600 through an adhesive member 2110 provided on a bottom surface of the second carrier substrate 2100. For example, the adhesive member 2110 may include a glue tape.

Afterwards, the first carrier substrate 2000 may be removed to expose the bottom surface of the connection substrate 400 and the active surface 500a of the semiconductor chip 500. When the adhesive member 2010 is present on the first carrier substrate 2000, the adhesive member 2010 may also be removed together with the first carrier substrate 2000.

Referring to FIG. 19, the second carrier substrate 2100 may be turned over. Therefore, the connection substrate 400 and the semiconductor chip 500 may be positioned on the second carrier substrate 2100, and the active surface 500a of the semiconductor chip 500 may be directed upwards.

A package substrate 100 may be formed on the connection substrate 400 and the semiconductor chip 500. For example, a substrate dielectric pattern 110 and a substrate wiring pattern 120 may be formed on the top surface of the connection substrate 400 and on the active surface 500a of the semiconductor chip 500, with the result that the package substrate 100 may be manufactured. For more detail, a dielectric layer may be formed on the top surface of the connection substrate 400 and on the active surface 500a of the semiconductor chip 500, the dielectric layer may be patterned to expose upper pads 422 of the connection substrate 400 and to also expose chip pads 510 of the semiconductor chip 500, a conductive layer may be formed below the dielectric layer, and the conductive layer may be patterned to form the substrate wiring pattern 120. Therefore, one substrate wiring layer may be formed, and the process mentioned above may be repeatedly performed to form the package substrate 100 that includes a plurality of substrate wiring layers. The substrate wiring pattern 120 may be coupled to the upper pads 422 of the connection substrate 400 and to the chip pads 510 of the semiconductor chip 500. The substrate wiring pattern 120 in an uppermost one of the substrate wiring layers may correspond to first substrate pads 122 for mounting a subsequently discussed power module 200 on the package substrate 100 and to second substrate pads 124 for mounting a subsequently discussed connector 300 on the package substrate 100.

Thereafter, a dielectric layer may be formed on the uppermost substrate wiring layer, and then a recess may be formed to expose the first substrate pads 122 and the second substrate pads 124, with the result that a first protection layer 102 may be formed.

Figure 20:
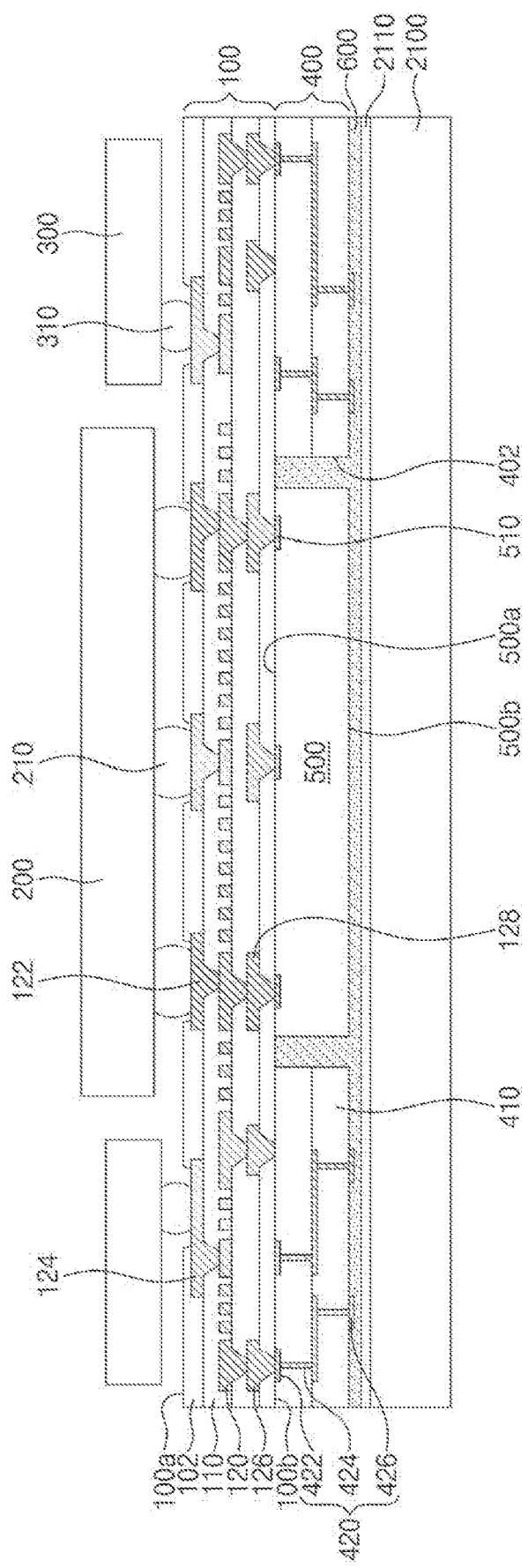

Referring to FIG. 20, a power module 200 and a connector 300 may be mounted on the package substrate 100. The power module 200 and the connector 300 may be flip-chip mounted on the package substrate 100. For example, module terminals 210 may be provided on pads of the power module 200, the power module 200 may be positioned to allow the module terminals 210 to rest on the first substrate pads 122 of the package substrate 100, and then the module terminals 210 may undergo a reflow process to mount the power module 200 on the package substrate 100. For example, connector terminals 310 may be provided on pads of the connector 300, the connector 300 may be positioned to allow the connector terminals 310 to rest on the second substrate pads 124 of the package substrate 100, and then \ the connector terminals 310 may undergo a reflow process to mount the connector 300 on the package substrate 100.

Figure 21:
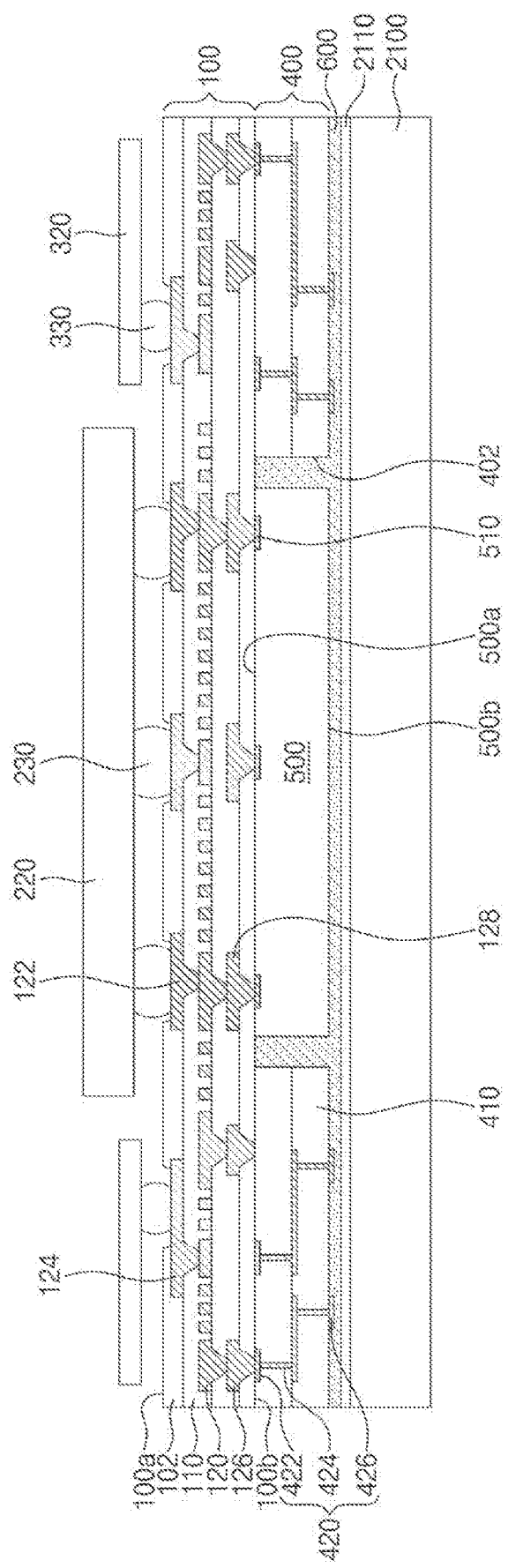

In some embodiments, as shown in FIG. 21, before the power module 200 and the connector 300 are mounted on the package substrate 100, a module socket 220 and an interposer 320 may be mounted in advance on the package substrate 100. The module socket 220 may be mounted through socket terminals 230 on the first substrate pads 122 of the package substrate 100, and the interposer 320 may be mounted through interposer terminals 330 on the second substrate pads 124 of the package substrate 100. After that, the power module 200 may be coupled to the module socket 220, and the connector 300 may be mounted on the interposer 320. In this configuration, the semiconductor package discussed with reference to FIG. 11 may be fabricated. The following description will focus on the embodiment of FIG. 20.

Figure 22:
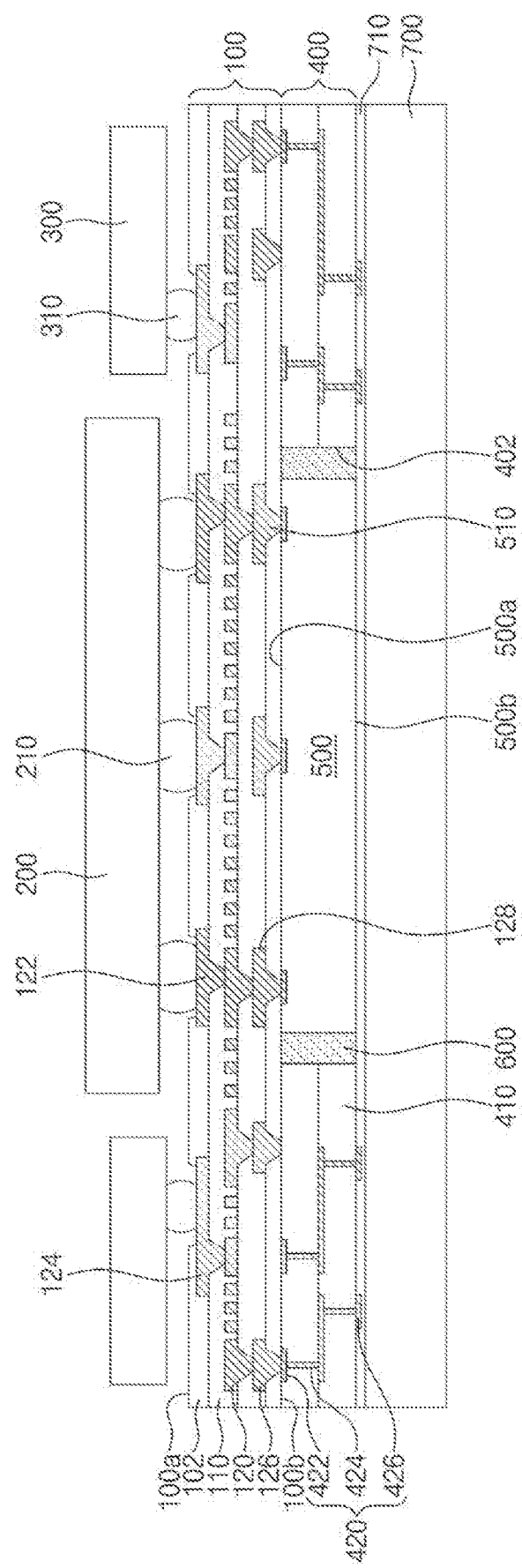

Referring to FIG. 22, the second carrier substrate 2100 may be removed to expose the bottom surface of the connection substrate 400 and the inactive surface 500b of the semiconductor chip 500. When the adhesive member 2110 is present on the second carrier substrate 2100, the adhesive member 2110 may also be removed together with the second carrier substrate 2100.

A heat radiator 700 may be attached to the connection substrate 400 and the semiconductor chip 500. For example, the heat radiator 700 may be attached through and adhesive film 710 to the exposed bottom surface of the connection substrate 400 and to the exposed inactive surface 500b of the semiconductor chip 500.

The process mentioned above may fabricate the semiconductor package discussed with reference to FIG. 1.

Figure 23:
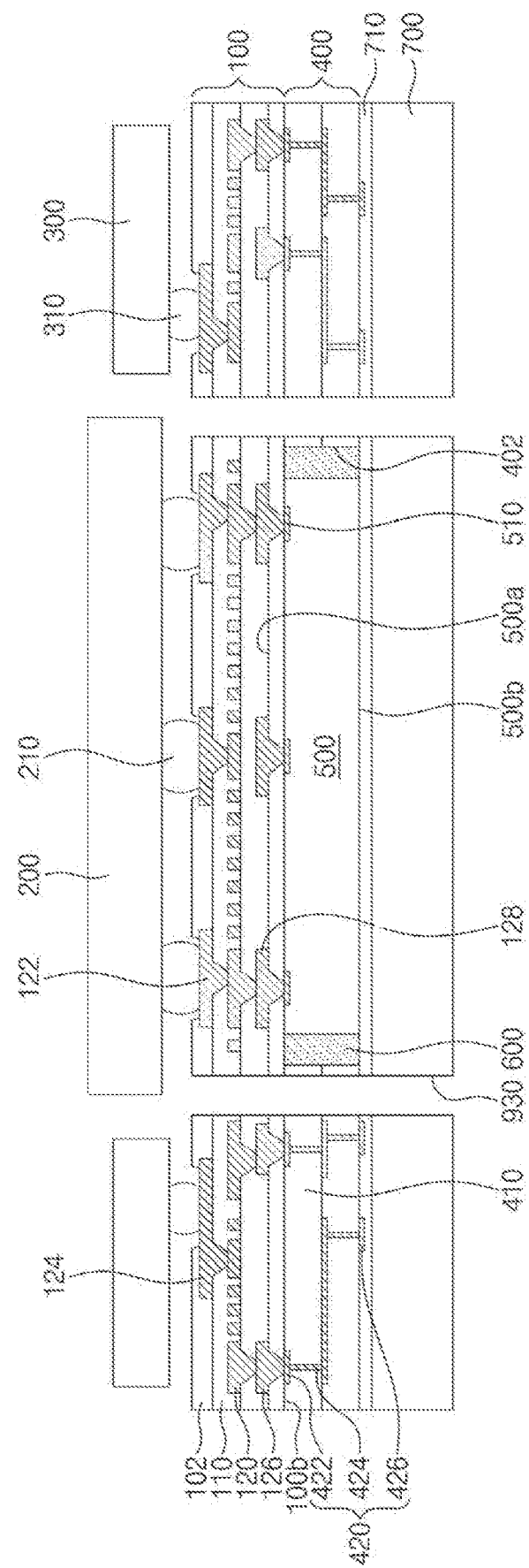

Referring to FIG. 23, on a structure of FIG. 22, a through hole 930 may be formed to vertically penetrate the package substrate 100, the connection substrate 400, and the heat radiator 700. The through hole 930 may be formed spaced apart from the semiconductor chip 500.

Afterwards, a fixing member 900 may be inserted into the through hole 930, and then a fixing part 910 coupled to the fixing member 900 may be formed on a top surface 100*a* of the package substrate 100 and on a bottom surface of the heat radiator 700.

The process mentioned above may fabricate the semiconductor package discussed with reference to FIG. 12.

A semiconductor package according to some embodiments may be configured such that a power module, a connector, and a semiconductor chip are all coupled to a single package substrate, and thus the semiconductor package may have short electrical paths therein. In addition, since the power module and the semiconductor chip are respectively on opposite surfaces of the package substrate so as to vertically overlap each other, the package substrate may have therein a minimized horizontal electrical path. Therefore, the electrical path may be excessively short between the power module and the semiconductor chip, and the semiconductor package may increase in electrical properties. Furthermore, the opposite surfaces of the package substrate may be used as areas for mounting devices, and in particular, one package substrate may be provided thereon with the semiconductor chip, the connector for external connection, and the power module for power supply, with the result that the semiconductor package may become small in size.

Moreover, because the power module and the connector are provided on a top surface of the package substrate, and because the semiconductor chip is provided on a bottom surface of the package substrate, the semiconductor package may be coupled to an external device through the connector without being mounted on a separate substrate. Therefore, a heat radiator may be provided on a rear surface of the semiconductor chip, and the semiconductor package may increase in thermal radiation efficiency. Accordingly, the semiconductor package may improve in operating stability.

Although various embodiments have been described in connection with the accompanying drawings, it will be understood by one of ordinary skill in the art that variations in form and detail may be made therein without departing from the spirit and scope of the present disclosure as set forth in the attached claims. The above disclosed embodiments should thus be considered illustrative and not restrictive.

What is claimed is:

1. A semiconductor package comprising:
a package substrate;
a power module on a first surface of the package substrate;
a connector on the first surface of the package substrate, the connector being horizontally spaced apart from the power module;
a first semiconductor chip on a second surface of the package substrate opposite to the first surface;
a first heat radiator on the second surface of the package substrate, the first heat radiator covering the first semiconductor chip;
a connection substrate on the second surface of the package substrate and having an opening that penetrates the connection substrate, the first semiconductor chip being in the opening; and
a dielectric layer in the opening and filling a space between the connection substrate and the first semiconductor chip,
wherein the first heat radiator is attached to one surface of the connection substrate and to a rear surface of the first semiconductor chip,
wherein at least a portion of the first semiconductor chip vertically overlaps the power module, and
wherein the first semiconductor chip is electrically connected through the package substrate to the power module.

2. The semiconductor package of claim 1, further comprising:
a through electrode that vertically penetrates the dielectric layer and is coupled to the package substrate,
wherein the rear surface of the first semiconductor chip is exposed on one surface of the dielectric layer, and
wherein the first heat radiator is attached to the rear surface of the first semiconductor chip.

3. The semiconductor package of claim 1, wherein each of the first semiconductor chip includes:
a first interposer on the package substrate;
a die stack on the first interposer and including a plurality of vertically stacked first dies; and
a second die on the first interposer, the second die being horizontally spaced apart from the die stack.

4. The semiconductor package of claim 1, wherein the semiconductor package is connected to an external device through a cable coupled to the connector.

5. The semiconductor package of claim 1, wherein
the power module and the connector are flip-chip mounted on the first surface of the package substrate, and
the first semiconductor chip is in contact with the second surface of the package substrate and chip pads of the first semiconductor chip are directly connected to substrate pads of the package substrate.

6. The semiconductor package of claim 1, further comprising a fixing member on one side of the first semiconductor chip, the fixing member penetrating the first heat radiator and the package substrate,
wherein the first heat radiator is fixed to the package substrate by the fixing member.

7. The semiconductor package of claim 1, further comprising a module socket on the first surface of the package substrate,
wherein the power module is connected to the module socket.

8. A semiconductor package comprising:
a package substrate having a central region and a peripheral region on opposite sides of the central region, the peripheral region being at an outer edge of the package substrate;
a power module on the central region and on a first surface of the package substrate;
a heat radiator on a second surface of the package substrate;
a first connection substrate between the package substrate and the heat radiator and having a first opening that penetrates the first connection substrate;
a first semiconductor chip on the second surface of the package substrate and in the first opening of the first connection substrate; and
a first dielectric layer in the first opening and filling a space between the first connection substrate and the first semiconductor chip,
wherein an active surface of the first semiconductor chip is in contact with the package substrate, and
wherein the first semiconductor chip is electrically connected through the package substrate to the power module.

9. The semiconductor package of claim 8, further comprising a connector on the peripheral region and on the first surface of the package substrate, the connector being horizontally spaced apart from the power module,
    wherein the semiconductor package is connected to an external device through a cable coupled to the connector.

10. The semiconductor package of claim 9, further comprising a first interposer on the first surface of the package substrate,
    wherein the connector is electrically connected through the first interposer to the package substrate.

11. The semiconductor package of claim 8, wherein the first semiconductor chip vertically overlaps the power module.

12. The semiconductor package of claim 8, further comprising:
    a wiring layer between the first connection substrate and the heat radiator;
    a second connection substrate between the wiring layer and the heat radiator and having a second opening that penetrates the second connection substrate;
    a second semiconductor chip on the wiring layer and in the second opening of the second connection substrate; and
    a second dielectric layer in the second opening and filling a space between the second connection substrate and the second semiconductor chip,
    wherein the heat radiator is attached to a rear surface of the second semiconductor chip.

13. The semiconductor package of claim 12, wherein
    the first connection substrate includes a conductive pattern that connects the package substrate to the wiring layer, the conductive pattern being in a first region of the first connection substrate, and
    the first connection substrate further includes a plurality of passive elements on a second region of the first connection substrate that is spaced apart from the first region.

14. The semiconductor package of claim 8, wherein
    the power module is mounted on the package substrate through a connection terminal between the power module and the package substrate, and
    a plurality of chip pads of the first semiconductor chip are directly connected to a plurality of substrate pads of the package substrate.

15. A semiconductor package comprising:
    a package substrate having a central region and a peripheral region on opposite sides of the central region, the peripheral region being at an outer edge of the package substrate;
    a power module on the central region and on a first surface of the package substrate;
    a connector on the peripheral region and on the first surface of the package substrate;
    a first semiconductor chip on a second surface of the package substrate;
    a connection substrate on the second surface of the package substrate and having an opening that penetrates the connection substrate, the first semiconductor chip being in the opening;
    a first dielectric layer in the opening and filling a space between the connection substrate and surrounding the first semiconductor chip; and
    a first heat radiator attached to one surface of the connection substrate and to a rear surface of the first semiconductor chip,
    wherein the first semiconductor chip includes:
        a first interposer on the package substrate;
        a die stack on the first interposer and including a plurality of vertically stacked first dies;
        a second die on the first interposer and horizontally spaced apart from the die stack; and
        a molding layer on the first interposer and surrounding the die stack and the second die, the molding layer exposing a top surface of the die stack, and
    wherein the semiconductor package is connected to an external device through a cable coupled to the connector.

* * * * *